United States Patent
Falck et al.

(10) Patent No.: US 9,324,783 B2
(45) Date of Patent: Apr. 26, 2016

(54) SOFT SWITCHING SEMICONDUCTOR DEVICE AND METHOD FOR PRODUCING THEREOF

(71) Applicant: Infineon Technologies AG, Neubiberg (DE)

(72) Inventors: Elmar Falck, Hohenbrunn (DE); Gerhard Schmidt, Wernberg (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/501,298

(22) Filed: Sep. 30, 2014

(65) Prior Publication Data

US 2016/0093690 A1    Mar. 31, 2016

(51) Int. Cl.
| | |
|---|---|
| *H01L 29/739* | (2006.01) |
| *H01L 29/06* | (2006.01) |
| *H01L 21/761* | (2006.01) |
| *H01L 21/765* | (2006.01) |

(52) U.S. Cl.
CPC ............ *H01L 29/063* (2013.01); *H01L 21/761* (2013.01); *H01L 21/765* (2013.01); *H01L 29/7393* (2013.01)

(58) Field of Classification Search
CPC . H01L 29/063; H01L 29/7393; H01L 21/761; H01L 21/765
See application file for complete search history.

(56) References Cited

U.S. PATENT DOCUMENTS

| 8,361,893 B2 | 1/2013 | Schmidt et al. |
| 2005/0161746 A1 | 7/2005 | Mauder et al. |
| 2007/0170514 A1 | 7/2007 | Mauder et al. |
| 2009/0224284 A1 | 9/2009 | Nemoto |
| 2009/0298270 A1 | 12/2009 | Mauder et al. |
| 2010/0210091 A1 | 8/2010 | Mauder et al. |
| 2011/0042791 A1 | 2/2011 | Schulze et al. |
| 2013/0049176 A1 | 2/2013 | Mauder et al. |

FOREIGN PATENT DOCUMENTS

| DE | 3631136 A1 | 3/1988 |
| DE | 10361136 A1 | 7/2005 |
| DE | 102008025733 A1 | 12/2009 |

OTHER PUBLICATIONS

Suekawa, E. et al., "High Voltage IGBT(HV-IBGT) having p+/p-Collector Region", Proceedings of 1998 International Symposium on Power Semiconductor Devices & ICs, Kyoto, Japan, Jun. 3-6, 1998, pp. 249-252.
Felsl, H. P. et al., "Semiconductor Diode and Method of Manufacturing a Semiconductor Diode." Co-pending U.S. Appl. No. 14/162,311, filed Jan. 23, 2014.

*Primary Examiner* — Whitney T Moore
(74) *Attorney, Agent, or Firm* — Murphy, Bilak & Homiller, PLLC

(57) ABSTRACT

A semiconductor device has a semiconductor body with a first side and a second side that is arranged distant from the first side in a first vertical direction. The semiconductor device has a rectifying junction, a field stop zone of a first conduction type, and a drift zone of a first conduction type arranged between the rectifying junction and the field stop zone. The semiconductor body has a net doping concentration along a line parallel to the first vertical direction. At least one of (a) and (b) applies:
  (a) the drift zone has, at a first depth, a charge centroid, wherein a distance between the rectifying junction and the charge centroid is less than 37% of the thickness the drift zone has in the first vertical direction;
  (b) the absolute value of the net doping concentration comprises, along the straight line and inside the drift zone, a local maximum value.

24 Claims, 25 Drawing Sheets

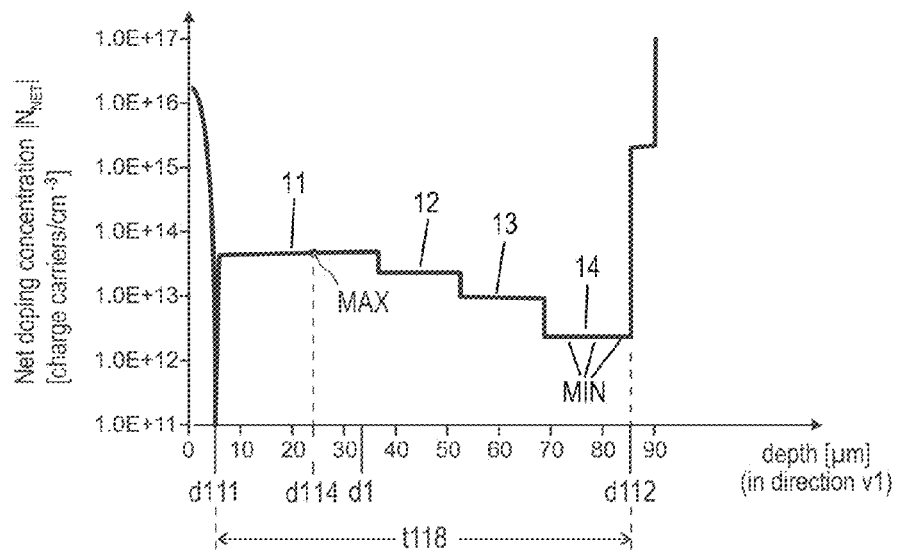
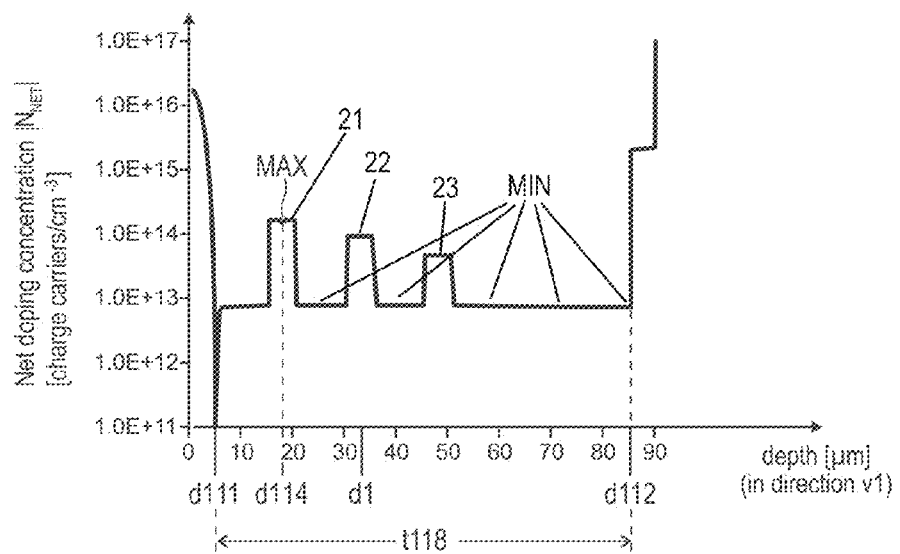

SOFT SWITCHING SEMICONDUCTOR DEVICE AND METHOD FOR PRODUCING THEREOF

TECHNICAL FIELD

The present invention relates to a soft switching semiconductor device having low switching losses and to a method for producing such a semiconductor device.

BACKGROUND

Conventional semiconductor devices often tend to show a switching behavior with pronounced oscillations and/or switching losses.

Hence, there is a need for an improved semiconductor device and a method for producing an improved semiconductor device.

SUMMARY

A first aspect relates to a semiconductor device. The semiconductor device has a semiconductor body with a first side and a second side opposite the first side. The second side is arranged distant from the first side in a first vertical direction. The semiconductor device further has a rectifying junction, a field stop zone arranged in the semiconductor body, and a drift zone arranged in the semiconductor body between the rectifying junction and the field stop zone. Both the field stop zone and the drift zone have a first conduction type. Along a straight line running parallel to the first vertical direction, the semiconductor body has a net doping concentration $N_{NET}$. Thereby, at least one of (a) and (b) applies:

a. the drift zone has, at a first depth, a doping charge centroid, wherein a distance between the rectifying junction and the doping charge centroid is less than 37% of a thickness of the drift zone in the first vertical direction;

b. the absolute value of the net doping concentration has, along the straight line and inside the drift zone, a local maximum value.

A second aspect relates to a method for producing a semiconductor device. The method includes the steps of providing a semiconductor carrier, producing a semiconductor construct on the semiconductor carrier, thereby epitaxially growing a crystalline semiconductor structure on the semiconductor carrier, and, afterwards, removing the semiconductor carrier so that a semiconductor device remains that has a semiconductor body with a first side and a second side opposite the first side with. The second side is arranged distant from the first side in a first vertical direction. The semiconductor device further has a rectifying junction, a field stop zone arranged in the semiconductor body, and a drift zone arranged in the semiconductor body between the rectifying junction and the field stop zone. Both the field stop zone and the drift zone have a first conduction type. Along a straight line running parallel to the first vertical direction, the semiconductor body has a net doping concentration $N_{NET}$. Thereby, at least one of (a) and (b) applies:

c. the drift zone has, at a first depth, a charge doping centroid, wherein a distance between the rectifying junction and the doping charge centroid is less than 37% of the thickness the drift zone has in the first vertical direction;

d. the absolute value of the net doping concentration has, along the straight line and inside the drift zone, a local maximum value.

A third aspect relates to a method for producing a semiconductor device. The method includes the steps of providing a semiconductor body having a first side and a second side opposite the first side. Electrically active first and second dopants causing a first conduction type are diffused through the first side into the semiconductor body. The first dopants have a diffusion coefficient in the semiconductor body higher than a diffusion coefficient of the second dopants. Further, a rectifying junction is produced, and a field stop zone of the first conduction type arranged in the semiconductor body. The resulting semiconductor body further has a drift zone of the first conduction type arranged in the semiconductor body between the rectifying junction and the field stop zone. The completed semiconductor device has a semiconductor body with a first side and a second side opposite the first side. The second side is arranged distant from the first side in a first vertical direction. The semiconductor device further has a rectifying junction, a field stop zone arranged in the semiconductor body, and a drift zone arranged in the semiconductor body between the rectifying junction and the field stop zone. Both the field stop zone and the drift zone have a first conduction type. Along a straight line running parallel to the first vertical direction, the semiconductor body has a net doping concentration $N_{NET}$. Thereby, at least one of (a) and (b) applies:

e. the drift zone has, at a first depth, a doping charge centroid, wherein a distance between the rectifying junction and the doping charge centroid is less than 37% of the thickness the drift zone has in the first vertical direction;

f. the absolute value of the net doping concentration has, along the straight line and inside the drift zone, a local maximum value.

BRIEF DESCRIPTION OF THE DRAWINGS

Exemplary embodiments of the present invention are explained in more detail below with reference to the following drawings. The drawings serve to illustrate the basic principle, so that only aspects necessary for understanding the basic principle are illustrated. The drawings are not to scale. In the drawings the same reference characters denote like features.

FIG. 10 is a further example of a doping profile of a semiconductor device of the present invention having, wherein the doping profile has inside the drift zone a staircase-shaped course.

FIG. 11 is a further example of a doping profile of a semiconductor device of the present invention having, wherein the doping profile has inside the drift zone a column-shaped course.

In the figures, unless indicated otherwise, identical reference symbols designate identical wafer regions or device regions with the same meaning.

DETAILED DESCRIPTION

In the following Detailed Description, reference is made to the accompanying drawings, which form a part thereof, and in which is shown by way of illustration specific embodiments in which the invention may be practiced. It is to be understood that the features of the various exemplary embodiments described herein may be combined with each other, unless specifically noted otherwise.

Figure 1:
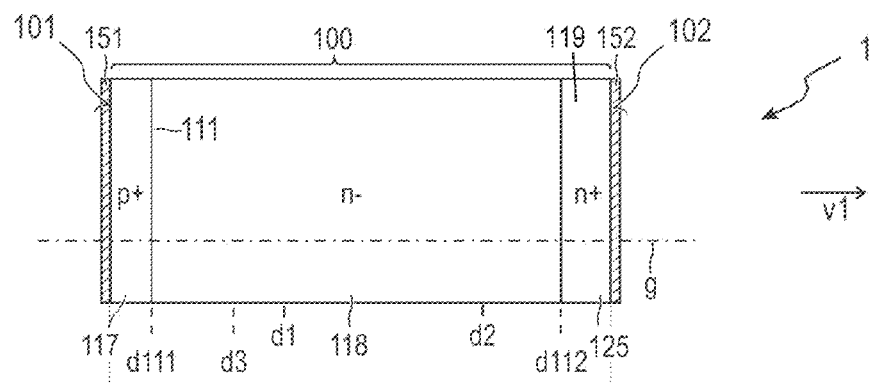
FIG. 1 is a cross-sectional view of a section of a semiconductor device according to a first embodiment.

FIG. 1 is a cross-sectional view of a section of a semiconductor device 1 which may be an individual semiconductor device, or one of a plurality of identical or non-identical semiconductor devices monolithically integrated in a common semiconductor wafer.

In any case, the semiconductor device 1 has a semiconductor body 100 with a first side 101 and a second side 102 opposite the first side 101. The second side 102 is arranged distant from the first side 101 in a first vertical direction v1 which may run perpendicular to the second side 102. In this regard it is to be noted that the first vertical direction v1 does not only include an axis but also an orientation. That means that the first side 101 is not arranged distant from the second side 102 in the first vertical direction v1 but in the opposite direction. Optionally, one or both of the first and second sides 101, 102 may be planar or substantially planar and run parallel to one another.

At a depth d111, the semiconductor device 1 has a rectifying junction 111, here a pn-junction. Unless noted otherwise, a "depth" in the sense of the present invention is to be determined in the first vertical direction v1 relative to the first side 101. A drift zone 118 having a first conduction type (here: "n−") is arranged, adjacent to the rectifying junction 111, between the rectifying junction 111 and the second side 102. The semiconductor device 1 further has field stop zone 119 having the first conduction type (here: "n+") and adjoining the drift zone 118 opposite the rectifying junction 111. That is, the drift zone 118 is arranged between the rectifying junction 111 and the field stop zone 119.

A first main electrode 151 is arranged on the first side 101, and a second main electrode 152 on the second side 102. Both the first and second electrodes 151, 152 may be metal electrodes. In the illustrated embodiment, the semiconductor device 1 is a diode in which the first main electrode 151 is an anode electrode and the second main electrode 152 is a cathode electrode.

The device may also include an emitter zone 125 arranged between the drift zone 118 and the second side 102. Such an emitter zone 125 has a doping concentration higher than the drift zone 118 and makes an ohmic contact with the second main electrode 102. The dose of the implanted dopant atoms of an emitter zone 125 may be in the range from $1 \cdot 10^{15}$ cm$^{-2}$ to $5 \cdot 10^{15}$ cm$^{-2}$ (1E15 cm$^{-2}$ to 5E15 cm$^{-2}$).

The conduction type of the emitter zone 125 may depend on the type of semiconductor device 1. In case of a diode, the emitter zone 125 has the same conduction type as the drift zone 118. If a semiconductor device 1 has a field stop zone 119, the emitter zone 125 is arranged between the field stop zone 119 and the second side 102.

In the illustrated embodiment, the rectifying pn-junction 111 is formed between the drift zone 118 and a heavily doped (here: p+) semiconductor zone 117 having a second conduction type complementary to the first conduction type and arranged between the first side 101 and the drift zone 118. The heavily doped (here: p+) semiconductor zone 117 is also referred to as "body zone".

Alternatively to a rectifying pn-junction, the rectifying junction 111 may also be a Schottky junction. In this case, d111 would be equal to 0 and the first main electrode 151 would be a Schottky metal electrode. In case of a Schottky junction 111, there is no semiconductor zone 117 so that the first main electrode 151 directly contacts the drift zone 118 which means that the drift zone 118 extends as far as the first side 101.

Figure 2:
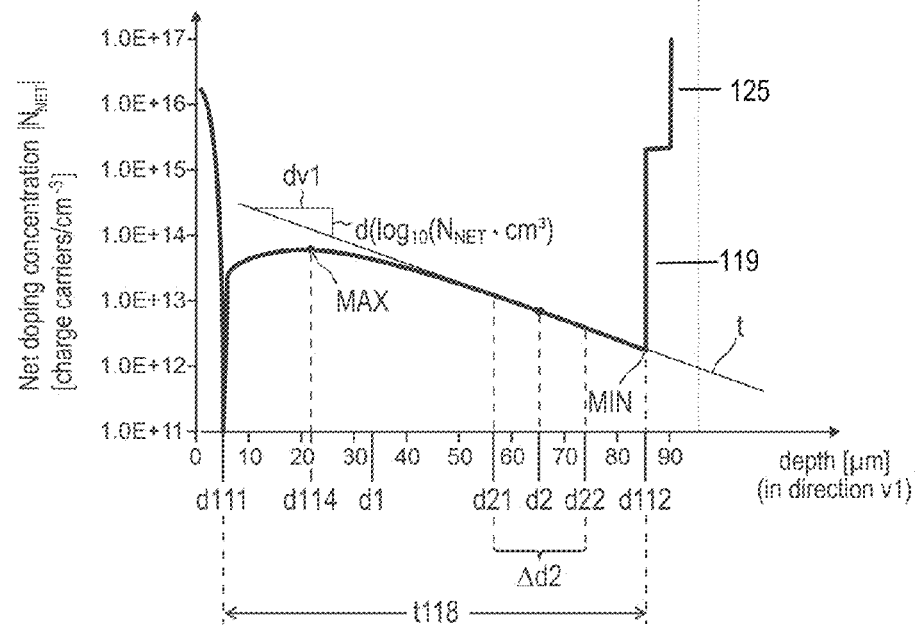
FIG. 2 is an example of a doping profile of a semiconductor device of the present invention.

In the first vertical direction v1, along a straight line g running parallel to the first vertical direction v1, the semiconductor body 100 has a net doping concentration $N_{NET}$ which is the difference ND-NA between the concentration ND of donors and the concentration NA of acceptors. An example of an absolute value $|N_{NET}|$ of the net doping concentration $N_{NET}$ of the semiconductor body 100 of FIG. 1 along the straight line g is illustrated in FIG. 2. In the sense of the present invention, the net doping concentration relates to the concentration of the electrically active charge carriers, i.e., electrons or holes.

At the rectifying junction 111, i.e., at the depth d111, the net doping concentration $N_{NET}$ is 0 (not shown in FIG. 2 because of the logarithmic scaling of the ordinate axis). Both the drift zone 118 and the field stop zone 119 have the first conduction type. In the present example, the first conduction type is "n". That is, there is a surplus of donors over acceptors. At a depth d112, the drift zone 118 ends and the field stop zone 119 begins. In other words, the border between the drift zone 118 and the field stop zone 119 is located at the depth d112.

As a general rule, the depth d112 is located in a continuous region (here: 118+119) having the first conduction type (here: "n") and emanating from the rectifying junction 111 towards the second side 102. The depth d112 is located—distant from the rectifying junction 111—at the lowest doping concentration MIN of all local minima the continuous region has in the first vertical direction v1. In this respect is to be noted that a local minimum that may occur at the rectifying junction 111 (e.g. if the rectifying junction 111 is a pn-junction) is not regarded to be one of the mentioned local minima. Further, if the continuous region has more than one location having the same lowest doping concentration, the depth d112 is defined by the depth of that one of all those locations that is located furthest from the rectifying junction 111.

Within the field stop zone 119, the doping concentration has a positive gradient dM/dv1, wherein M is the absolute measure of the net doping concentration $N_{NET}$ given in $cm^{-3}$. For instance, if $N_{NET}=5\cdot10^{13}$ cm$^{-3}$ (5E13 cm$^{-3}$), M is equal to $5\cdot10^{13}$ or 5E13. Generally, the gradient dM/dv1 is equal to the gradient $d(N_{NET}\cdot cm^3)/dv1$.

Optionally, a field stop zone 119 may have a charge carrier dose of at least 50% of the break down charge of the semiconductor material. The charge carrier dose of the field stop zone 119 is defined as the integral of the Net doping concentration $N_{NET}$ along the straight line g over the depth range of the field stop zone 119. For instance, the break down charge of silicon is about $1.4\cdot10^{12}$ cm$^{-2}$ (1.4E12 cm$^{-2}$) and corresponds to a break down field strength of about $2\cdot10^5$ V/cm (2E5 V/cm), and the break down charge of silicon carbide is about $1.4\cdot10^{13}$ cm$^{-2}$ (1.4E13 cm$^{-2}$) and corresponds to a break down field strength of about $2\cdot10^6$ V/cm (2E6 V/cm).

Further, the maximum value the absolute value of the net doping concentration $|N_{NET}|$ has along the straight line g and inside the drift zone 118 is designated with MAX. The maximum value MAX is located at a depth d114 greater than d111 and less than d112. That is, the distance between the doping charge centroid and the rectifying junction 111 is greater than zero and less than 37% of the thickness t118 the drift zone 118 has in the first vertical direction v1.

Optionally, also in the further embodiments described herein, the depth d114 may be chosen such that d111<d114<d111+0.50·t118. In other words, the distance between the location of the maximum value MAX and the rectifying junction 111 is greater than zero and less than 50% of the thickness t118 the drift zone 118 has in the first vertical direction v1.

In the first vertical direction v1, the drift zone 118 has a thickness t118 and, at a first depth d1, a doping charge centroid. That is, the following formula applies:

$$\int_{d111}^{d1} N_{NET} dv1 = \int_{d1}^{d112} N_{NET} dv1$$

Thereby, $N_{NET}$ is the net doping concentration, v1 is the first vertical direction, d111 is the depth of the rectifying junction 111, and d112 is the depth of a border between the drift zone 118 and the field stop zone 119. The location of the doping charge centroid is chosen such that d111<d1<d111+0.37·t118. That is, the distance between the doping charge centroid and the rectifying junction 111 is greater than zero and less than 37% of the thickness t118 the drift zone 118 has in the first vertical direction v1.

According to an optional first feature that may be realized in any semiconductor device having a drift zone, the decimal logarithm of the product of ($N_{NET}\cdot cm^3$) has, in the drift zone 118 at a second depth d2 and in the first vertical direction v1, a (negative) gradient of less than—0.01/μm (minus 0.01/μm), or even of less than—0.02/μm (minus 0.02/μm). That is, starting from the second depth d2, the net doping concentration $N_{NET}$ decreases towards the second side 102. The gradient ($N_{NET}\cdot cm^3$) has at d2 is equal to the slope of the tangent t to the curve of the product ($N_{NET}\cdot cm^3$) at the second depth d2. The second depth d2 is greater than d111 and less than d112.

Optionally, there may be a depth range Δd2 from a depth d21 to a depth d22 (i.e., Δd2=d22−d21), within which for each second depth d2 with d21≤d2≤d22 the above-mention criterion applies, that the decimal logarithm of the product ($N_{NET}\cdot cm^3$) has, in the drift zone 118 at the second depth d2 and in the first vertical direction v1, a (negative) gradient of less than—0.01/μm (minus 0.01/μm), or even of less than—0.02/μm (minus 0.02/μm). The difference depth range Δd2 may be, for instance, at least 10% of the thickness t118 of the drift zone 118.

When switching a semiconductor device off, the reverse recovery current may suddenly snap off with a virtually infinite slope. In combination with unavoidable stray inductances, high induced voltages can occur. This may result in the destruction of the semiconductor device itself or in the destruction of a device connected to the semiconductor device. In order to soften the switching behavior of the semiconductor device, a minority charge carrier delivering structure may optionally be provided in order to guarantee a minority carrier (here: hole) current flow to the rectifying junction until the end of the recovery process. When the semiconductor device 1 is being switched off, a space charge region originating from the rectifying junction 111 extends towards the second side 102. As soon as the space charge region reaches the minority charge carrier delivering structure 121, the minority charge carrier delivering structure 121 injects minority charge carriers which avoids a sudden current snap off. That is, the minority charge carrier delivering structure 121 increases the "softness" of the semiconductor device 1's switching behavior.

Examples for possible minority charge carrier delivering structures 121 will now be explained with reference to FIGS. 3 to 6. As illustrated in FIGS. 3 to 6, a minority charge carrier delivering structure 121 of a second conduction type (here: "p") that is complementary to the first conduction type (here: "n") may be embedded in the field stop zone 119. The minority charge carrier delivering structure 121 may be embedded in the field stop zone 119 such that each of a plurality of sections of the field stop zone 119 continuously extends between the drift zone 118 and the first side 102. Such a minority charge carrier delivering structure 121 may extend as far as the second side 102 where it is electrically connected to the second main electrode 152, see FIG. 3, and/or be arranged distant from the second side 102, see FIG. 4. In the latter case, the minority charge carrier delivering structure 121 may be floating.

The purpose of the minority charge carrier delivering structures 121 is to soften the switching behavior of the semiconductor device 1. If the semiconductor device 1 is switched off, the mobile charge carriers are removed from the drift zone 118. During that recovery process, a depletion region growing from the rectifying-junction towards the field stop zone 119 occurs in the drift zone 118. At the end of this process, the depletion region extends substantially up to the field stop zone 119, and at that time—if there was no charge carrier left or if there is no minority charge carrier delivering structure 121—the electric current through the semiconductor body 100 would rapidly decrease (reverse current snap-off). As a result of such an unfavorable switching off behavior, undesired high voltages can occur in inductivities connected to the semiconductor device 1. The situation becomes the more critical the higher the switching speed of the IGBT ("hard switching conditions") or the lower the current density (e.g. $\frac{1}{10}$ of the nominal current) gets.

Further, undesired voltage oscillations can occur. At the time the depletion region extends substantially as far as the field stop zone 119, the minority charge carrier delivering structure 121 injects charge carriers (holes in case of a p-doped minority charge carrier delivering structure 121) into the field stop zone 119 and softens the "snappy" switch-off behavior. That is, in a semiconductor device 1 having a minority charge carrier delivering structure 121, the maximum absolute value of time derivative of the current during the tail phase is lower as it would be without the minority charge carrier delivering structure 121, compare, e.g., FIGS. 23 and 24.

Figure 3:
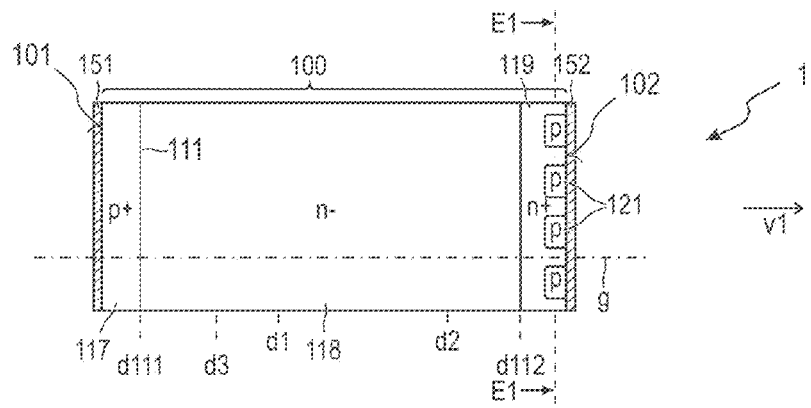
FIG. 3 is a cross-sectional view of a section of a semiconductor device according to a second embodiment.
Figure 4:
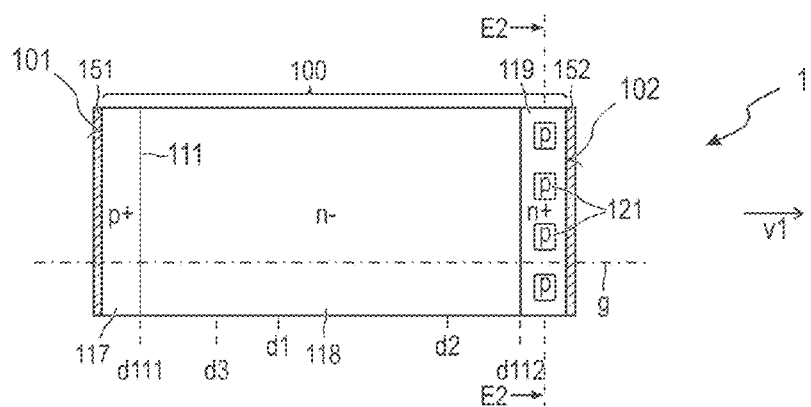
FIG. 4 is a cross-sectional view of a section of a semiconductor device according to a third embodiment.
Figure 5:
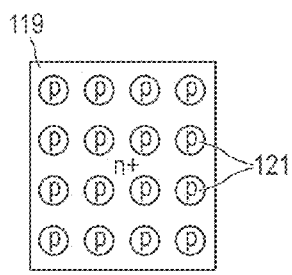
FIG. 5 is a cross-sectional view of a first example of the semiconductor devices of FIGS. 3 and 4 in a cross-sectional plane E1-E1 and E2-E2, respectively.
Figure 6:
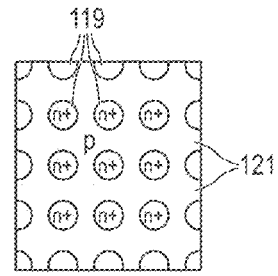
FIG. 6 is a cross-sectional view of a second example of the semiconductor devices of FIGS. 3 and 4 in a cross-sectional plane E1-E1 and E2-E2, respectively.

FIG. 5 illustrates an example of a cross-sectional view of the semiconductor devices of FIGS. 3 and 4 in cross-sectional planes E1-E1 and E2-E2, respectively, and FIG. 6 a further example. Each of the cross-sectional planes E1-E1 and E2-E2 intersects both the minority charge carrier delivering structure 121 and the field stop zone 119. As can be seen from FIG. 5, a minority charge carrier delivering structure 121 may have a plurality of islands arranged distant from one another, or, as illustrated in FIG. 6, be reticulated.

The semiconductor devices 100 illustrated in FIGS. 1 and 3 to 6 and/or explained with reference to FIGS. 1 to 6 are diodes. However, the same criteria and options explained with reference to FIGS. 1 to 6 may also apply to MOSFETs, IGBTs, thyristors, or any other semiconductor device having a drift zone 118 arranged between a rectifying junction 111 and a field stop zone 119. However, there is an exception that relates to IGBTs: As exemplarily illustrated in FIG. 7, in IGBTs, the field stop zone 119 does not extend as far as the second side 102. Instead, there is a collector zone 125 (sometimes also named as "emitter zone") arranged between the field stop zone 119 and the second side 102. The collector zone 125 has a conduction type complementary to the conduction type of the field stop zone 119 and may continuously extend between the field stop zone 119 and the second side 102.

The softness of the IGBT 1's switching behavior may be increased by a collector zone 125 having a first sub-region 123 and a second sub-region 124 each having a second conduction type (here: "p") complementary to the first conduction type (here: "n"). Both sub-regions 123, 124 intermesh and are arranged between the field stop zone 119 and the second side 102. The first sub-region 123 has a net doping concentration higher than a net doping concentration of the least second sub-region 124, so that the net doping concentration of the collector zone 125 has, along a straight line h running perpendicular to the first vertical direction v1 and intersecting the collector zone 125, several local maxima and several local minima. For instance, the straight line h may have a first point H1 located in the first sub-region 123 and a second point H2 located in the second sub-region 124. The collector zone 125 has a first net doping concentration at the first point H1, and a second net doping concentration at the second point H2 which is different from the first net doping concentration.

Figure 7:
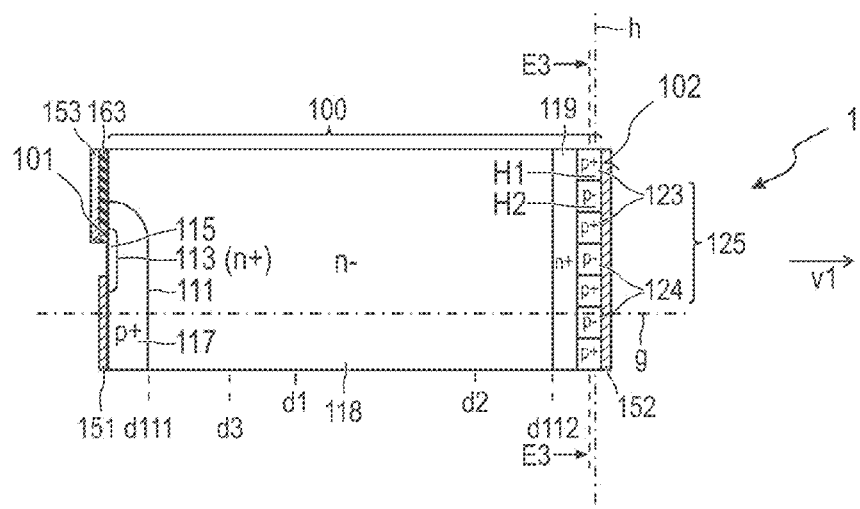
FIG. 7 is a cross-sectional view of a section of an IGBT according to a fourth embodiment.

As any IGBT, the IGBT 1 of FIG. 7 further has a source region 115 of the first conduction type (here: "n"), and, in addition to the first main electrode 151 (Source) and the second main electrode 152 (Drain), a control electrode 153 (Gate) that is electrically insulated from the semiconductor body 100 by a gate dielectric 163. the source region 115 is electrically connected to the first main electrode 151, and a further pn-junction 113 is formed between the source region 115 and the heavily doped semiconductor zone 117 which is also referred to as "body zone". Optionally, the control electrode 153 may be arranged in a trench that extends from the first side 101 into the semiconductor body 100.

Figure 8:
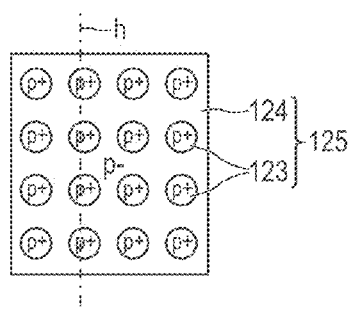
FIG. 8 is a cross-sectional view of a first example of the IGBT of FIG. 7 in a cross-sectional plane E3-E3.
Figure 9:
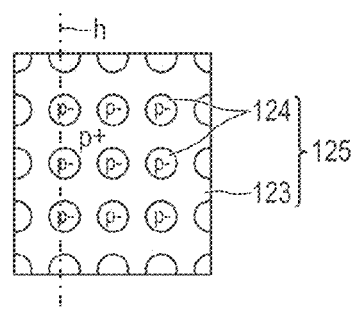
FIG. 9 is a cross-sectional view of a second example of the IGBT of FIG. 7 in a cross-sectional plane E3-E3.

FIG. 8 illustrates an example of a cross-sectional view of the semiconductor device 1 of FIG. 7 in a cross-sectional plane E3-E3, and FIG. 9 a further example. As can be seen from FIG. 8, the first sub-region 123 may have a plurality of islands arranged distant from one another, or, as illustrated in FIG. 9, be reticulated.

Any semiconductor device 1 according to the present invention may have a doping profile as explained above with reference to FIG. 2. The principles of further doping profiles along a straight line g running parallel to the first vertical direction v1 will now be explained with reference to FIGS. 10 and 11. The doping profiles of FIGS. 2, 10 and 11 differ from each other only in doping profile of the drift zones 118.

The doping profile of FIG. 10 has a staircase-shaped profile with at least one or at least two or at least three steps 11, 12, 13, 14. Within each of the steps 11, 12, 13, 14, the net doping concentration $N_{NET}$ is constant. If there are at least two steps, the doping profile may be adjusted such that for any two of the steps the one which is arranged closer to the first side 101 has the higher net doping concentration $N_{NET}$. According to the definition mentioned above with reference to FIG. 2, the location of the depth d112, i.e., the depth of the border between the drift zone 118 and the field stop zone 119, is determined as follows: In a first step, a continuous region having the first conduction type (here: "n") and emanating from the rectifying junction 111 towards the second side 102 has to be identified. In the present example, the continuous region emanates from the rectifying junction and extends as far as the second side 102. In a second step, all local minima of the continuous region which are different from a possible local minimum at the rectifying junction 111 are to be identified. In the present example, there is only one local minimum in a depth range between about 70 μm and 85 μm. As the doping concentration within this depth range is substantially constant (MIN), there is more than one location having the same lowest doping concentration MIN. In such a case, the depth d112 is defined by the depth of that one of all those locations having the same lowest doping concentration MIN that is located furthest from the rectifying junction 111.

According to a further embodiment illustrated in FIG. 11, a doping profile may have at least one or at least two or at least three columns 21, 22, 23. If there are at least two columns 21, 22, 23, the doping profile may be adjusted such that for any two of the columns 21, 22, 23 the one which is arranged closer to the first side 101 has the higher maximum net doping concentration $N_{NET}$. According to the definition mentioned above with reference to FIG. 2, the location of the depth d112, i.e., the depth of the border between the drift zone 118 and the field stop zone 119, is determined as follows: In a first step, a continuous region having the first conduction type (here: "n") and emanating from the rectifying junction 111 towards the second side 102 has to be identified. In the present example, the continuous region emanates from the rectifying junction and extends as far as the second side 102. In a second step, all local minima of the continuous region which are different from a possible local minimum at the rectifying junction 111 are to be identified. In the present example, there are three local minima: a first local minimum between the first column 21 and the second column 22, a second local minimum between the second column 22 and the third column 23, and a third local minimum between the third column 23 and a depth of about 85 μm. As the doping concentration within these local minima is substantially constant (MIN), there is more than one location having the same lowest doping concentration MIN. Hence, the depth d112 is defined by the depth of that one of all those locations having the same lowest doping concentration MIN that is located furthest from the rectifying junction 111.

A staircase-shaped and/or column-shaped course of the doping profile or of a section of the doping profile allow for approximating smooth doping profiles as, for instance, explained with reference to FIG. 2, in particular the doping profile of a drift zone.

Figure 12A:
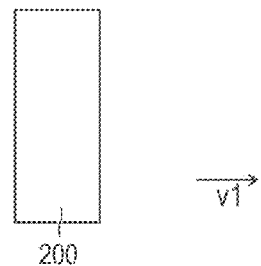
FIGS. 12A-G illustrate different steps of a possible method for producing a semiconductor device according to the first aspect.
Figure 12B:
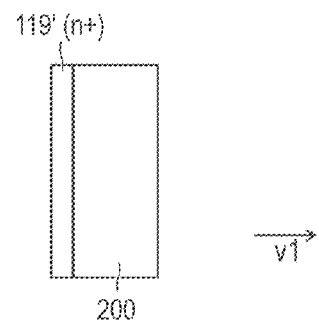

In order to produce a semiconductor device as described above with reference to FIGS. 1 to 6, a crystalline semiconductor carrier 200 may be provided, see FIG. 12A. Then, a semiconductor construct may be produced on the semiconductor carrier 200 in several subsequent steps. Thereby, a crystalline semiconductor structure may be epitaxially grown on the semiconductor carrier 200.

After the semiconductor construct is entirely or partially completed, the semiconductor carrier 200 may be removed so that the remainder is or includes a semiconductor body having the features of one of the semiconductor bodies 100 described above.

FIGS. 12A to 12F illustrate different steps for the production of a semiconductor body 100 as used for a semiconductor device 1 described with reference to FIGS. 1 and 3 to 6 having a doping profile according to the principles explained with reference to FIG. 2, 10 or 11.

After providing a semiconductor carrier 200 as illustrated in FIG. 12A, a heavily doped semiconductor zone 119' having the first conduction type (here: "n") is epitaxially grown on the semiconductor carrier 200 as shown as a result in FIG. 12B.

Figure 12C:
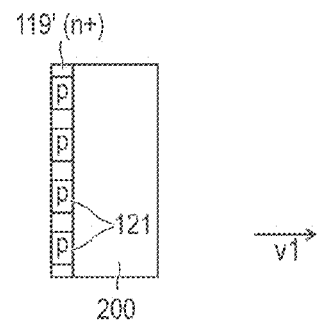
Figure 12D:
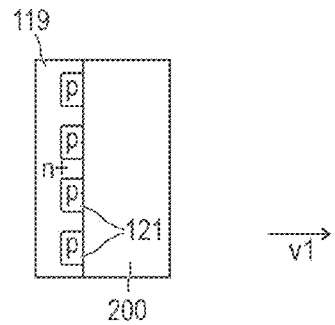

Then, in order to produce the minority charge carrier delivering structure 121 having the second conduction type (here: "p") in the semiconductor zone 119', dopants causing the second conduction type are introduced into the semiconductor zone 119' using any conventional method like masked diffusion or masked implantation. The result is illustrated in FIG. 12C. Optionally, the epitaxial growth of the semiconductor zone 119' may be continued as shown as a result in FIG. 12D.

Figure 12E:
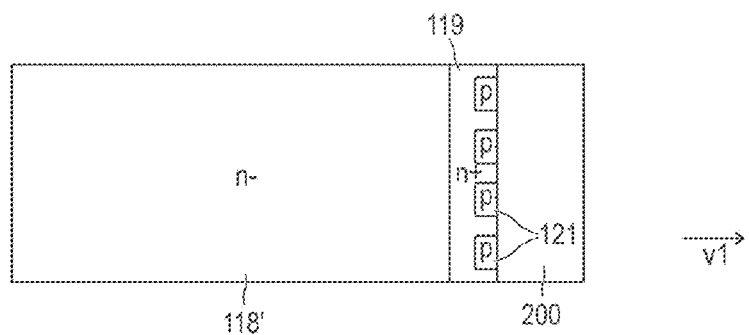

Then, a weakly doped semiconductor zone 118' having the first conduction type (here: "n") may be epitaxially grown on that side of the semiconductor zone 119 facing away from the semiconductor carrier 200. The result is illustrated in FIG. 12E.

Figure 12F:
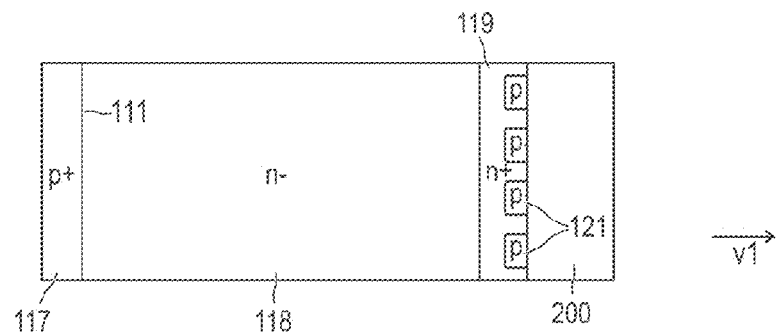

Then, in order to produce the semiconductor zone 117 having the second conduction type (here: "p"), dopants causing the second conduction type may be introduced into a sub-region of the weakly doped semiconductor zone 118' using any conventional method like diffusion or implantation, so that the conduction type of the sub-region is inverted from the first conduction type to the second conduction type, and that a rectifying junction 111 is formed between the semiconductor zone 117 and the remainder 118 of the semiconductor zone 118'. The result is an arrangement as illustrated in FIG. 12F.

Alternatively or in addition to forming a semiconductor zone 117 having the second conduction type by introducing dopants into a sub-region of the weakly doped semiconductor zone 118', epitaxially growing the weakly doped semiconductor zone 118' having the first conduction type may be stopped as soon as the growth has reached the level of the rectifying junction 111 to be formed. Then, the semiconductor zone 117 having the second conduction type (here: "p") may be epitaxially grown directly on that side of the weakly doped semiconductor zone 118' facing away from the semiconductor carrier 200, or a Schottky metal electrode may be deposited directly on that side of the weakly doped semiconductor zone 118' facing away from the semiconductor carrier 200. If growing the weakly doped semiconductor zone 118' is stopped at the level of the rectifying junction to be produced, the weakly doped semiconductor zone 118' may be identical to the drift zone 118 of the completed semiconductor device 1.

As explained above, the construct produced on the semiconductor carrier 200 includes at least a semiconductor zone 119 of the first conduction type and a drift zone 118 of the first conduction type, optionally also a semiconductor zone 117 having the second conduction type and/or a minority charge carrier delivering zone 121.

Figure 12G:
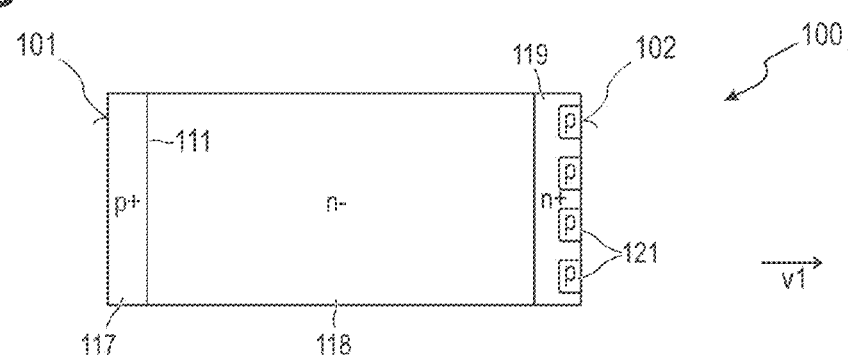

After producing the above-mentioned construct on the semiconductor carrier 200, the semiconductor carrier 200 is removed. The result is illustrated in FIG. 12G.

Figure 13A:
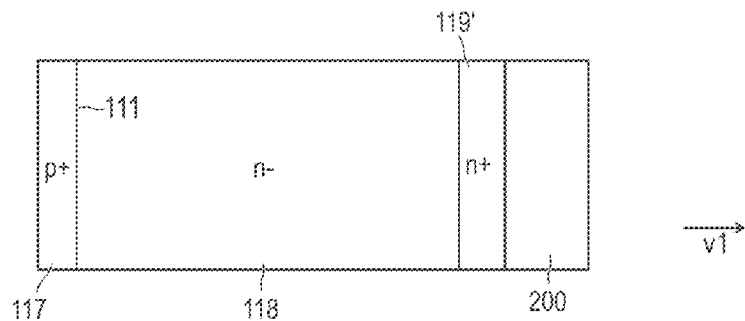
FIGS. 13A-C illustrate different steps of a method for producing a minority charge carrier delivering structure.

An alternative method for producing the minority charge carrier delivering zone 121 will now be explained with reference to FIGS. 13A to 13C. The process is the same as described with reference to FIGS. 12A to 12G but without the steps required for the masked diffusion or implantation in order to produce the minority charge carrier delivering zone 121. Instead, only the heavily doped semiconductor zone 119', the drift zone 118 and, if provided, the heavily doped semiconductor zone 117 are subsequently grown epitaxially as described before. The result is illustrated in FIG. 13A.

Figure 13B:
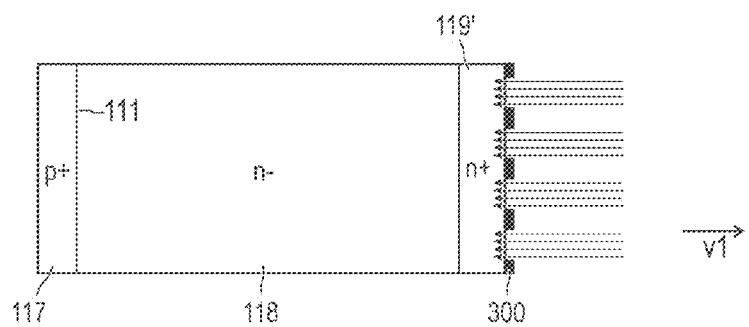
Figure 13C:
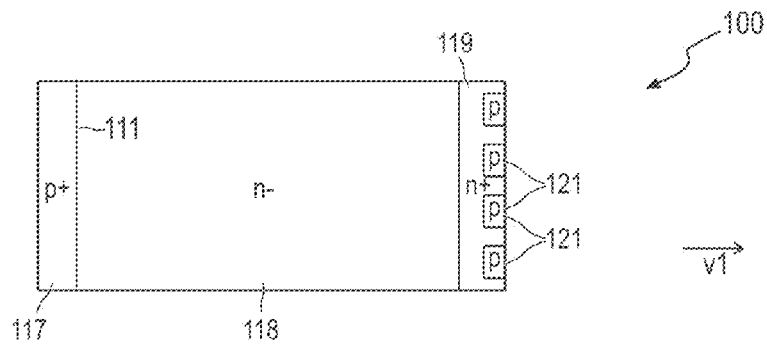

Subsequently, the semiconductor carrier 200 is removed and, as illustrated in FIG. 13B, dopants causing the second conduction type are implanted or diffused through openings of a mask 300 into the heavily doped semiconductor zone 119' in order to produce the minority charge carrier delivering zone 121. The dopants are schematically illustrated as arrows. The result is a semiconductor body 100 as illustrated in FIG. 13C and described with reference to FIGS. 3 to 6.

Figure 14A:
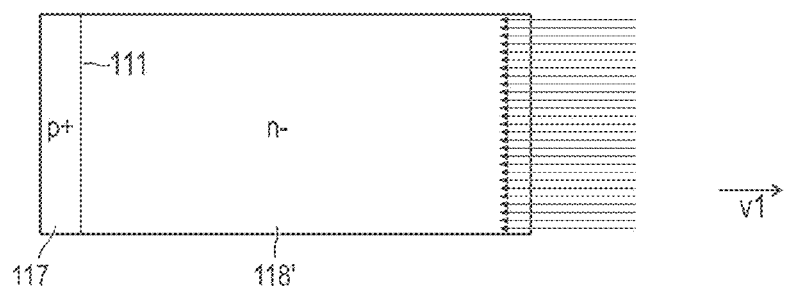
FIGS. 14A-B illustrate different steps of a method for producing a field stop zone.
Figure 14B:
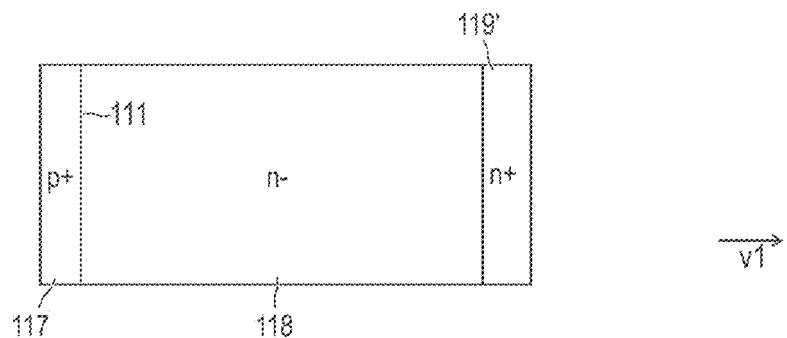

FIGS. 14A and 14B illustrate a further method for producing a field stop zone 119 with a minority charge carrier delivering structure embedded therein.

Analogously to the method described with reference to FIGS. 12A to 12G, FIGS. 15A to 14H illustrate different steps for the production of a semiconductor body 100 as used for an IGBT 1 described with reference to FIGS. 7 to 9 having a doping profile according to the principles explained with reference to FIGS. 7 to 9. In particular, the doping profile of the drift zone 118 may have the same properties as the doping profile of the drift zones 118 explained with reference to FIGS. 2, 10 and 11.

Figure 15A:
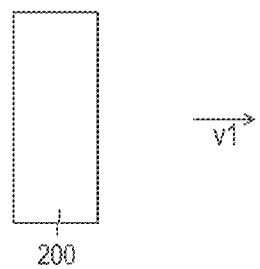
FIGS. 15A-H illustrate different steps of a further possible method for producing a semiconductor device according to the first aspect.
Figure 15B:
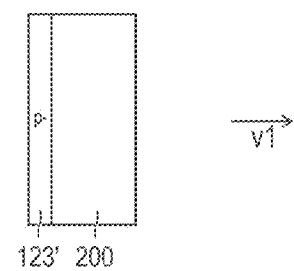

After providing a semiconductor carrier 200 as illustrated in FIG. 15A, a weakly doped semiconductor zone 123' having the second conduction type (here: "p") is epitaxially grown on the semiconductor carrier 200 as shown as a result in FIG. 15B.

Figure 15C:
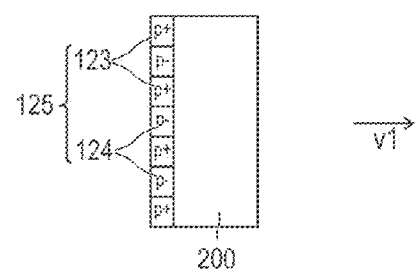

Then, in order to produce the first sub-region 123 having the second conduction type (here: "p") with a net doping concentration higher than the net doping concentration of the weakly doped semiconductor zone 123' in the weakly doped semiconductor zone 123', dopants causing the second conduction type are introduced into the weakly doped semiconductor zone 123' using any conventional method like masked diffusion or masked implantation. The result is a collector zone 125 having the second conduction type and including a first sub-region 123 and a second sub-region 124 as illustrated in FIG. 15C and as explained with reference to FIGS. 7 to 9.

Figure 15D:
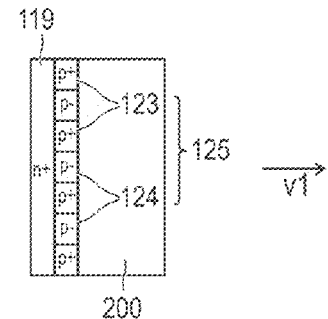

Then, the field stop zone 119 having the first conduction type (here: "n") is epitaxially grown on that side of the collector zone 125 facing away from the semiconductor carrier 200. The result is illustrated in FIG. 15D.

Figure 15E:
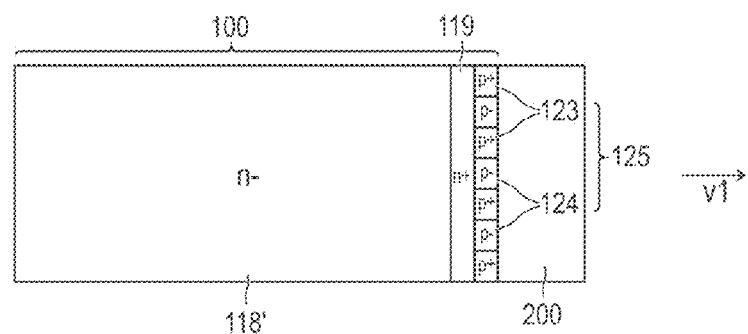
Figure 15F:
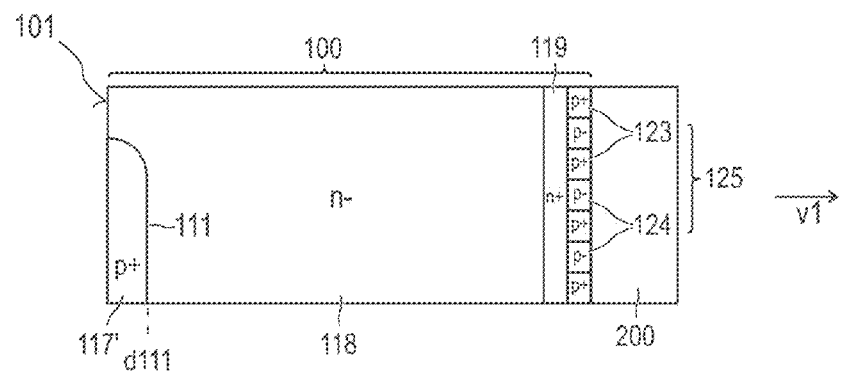

Then, a weakly doped semiconductor zone 118' having the first conduction type (here: "n") may be epitaxially grown on that side of the semiconductor zone 119 facing away from the semiconductor carrier 200. The result is illustrated in FIG. 15E.

Then, in order to produce a heavily doped semiconductor zone 117' having the second conduction type (here: "p"), dopants causing the second conduction type may be introduced into a sub-region of the weakly doped semiconductor zone 118' using any conventional method like masked diffusion or masked implantation, so that the conduction type of the sub-region is inverted from the first conduction type to the second conduction type, and that a rectifying junction 111 is formed between the heavily doped semiconductor zone 117' and the remainder 118 of the semiconductor zone 118'. The result is an arrangement as illustrated in FIG. 12F. The remainder 118 may be identical to the drift zone 118 of the semiconductor device 1 to be produced.

Figure 15G:
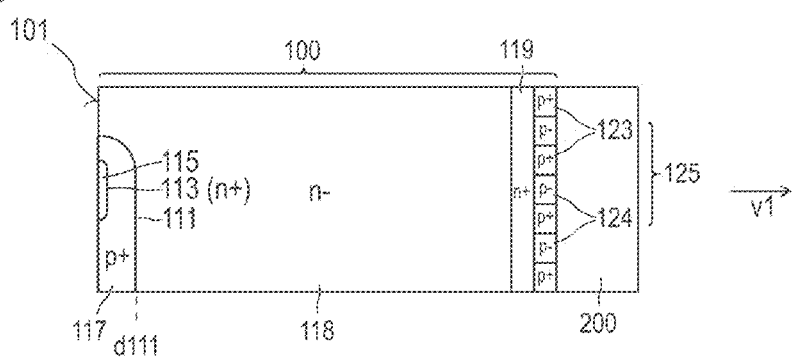

Then, in order to produce a heavily doped source zone 115 having the first conduction type (here: "n"), dopants causing the first conduction type may be introduced into a sub-region of the heavily doped semiconductor zone 117' using any conventional method like masked diffusion or masked implantation, so that the conduction type of the sub-region of the heavily doped semiconductor zone 117' is inverted from the second conduction type to the first conduction type, and that a further rectifying junction 113 is formed between heavily doped source zone 115 and the remainder 117 of the heavily doped semiconductor zone 117'. The result is an arrangement as illustrated in FIG. 15G. The remainder 117 may be identical to a body zone 118 of the IGBT to be produced.

As explained above with reference to FIGS. 15A to 14G, the construct produced on the semiconductor carrier 200 includes at least a semiconductor zone 119 of the first conduction type and a drift zone 118 of the first conduction type, optionally also a semiconductor zone 117 having the second conduction type and/or a source zone 115 and/or a collector zone 125 having a first sub-region 123 and/or first and second sub-regions 123, 124 as described above with reference to FIGS. 7 to 9.

Figure 15H:
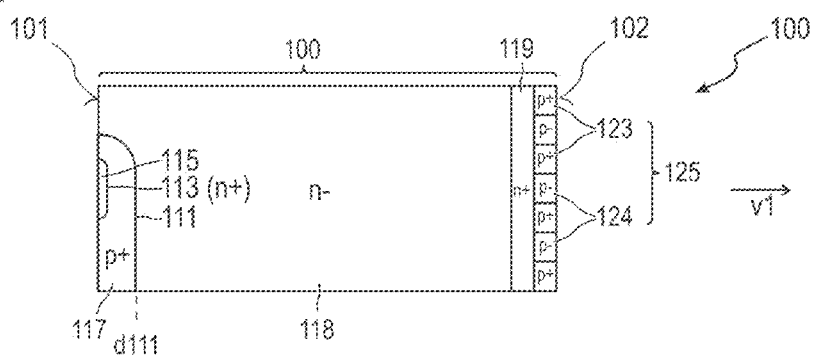

After producing the above-mentioned construct on the semiconductor carrier 200, the semiconductor carrier 200 is removed. The result is a semiconductor body 100 illustrated in FIG. 15H.

In any method for producing a semiconductor device 1 on a semiconductor carrier 200, the semiconductor carrier 200 may be a semiconductor wafer, e. g. a FZ wafer, a CZ wafer, or a MCZ wafer. Generally, semiconductor wafers are cut off from monocrystalline semiconductor ingots. In case of an FZ wafer, the respective ingot is produced using the float zone (FZ) method, in case of a CZ wafer, the respective ingot is produced using the Czochralski (CZ) method, and in case of a MCZ wafer, the respective ingot is produced using the Magnetic Czochralski (MCZ) method. However, compared with FZ or MCZ wafers, using a CZ wafer as semiconductor carrier 200 is cost-efficient. The lower quality of CZ wafers is irrelevant as the semiconductor carrier 200 is removed at a later time anyway. In principle, the diameter of a wafer used as semiconductor carrier 200 may be chosen freely. For instance, the diameter may be at least 8 inches (20.32 cm).

Adjusting the doping profile in the epitaxially grown zones can easily be achieved by appropriately controlling the concentration of precursors of the n- or p-doping dopants in the atmosphere of a reactor in which the epitaxy is carried out. The concentration may be adjusted by time-dependently controlling the inflow of the precursors into the reactor. In principle, the epitaxy allows for producing varying doping profiles.

In order to produce vertical semiconductor devices 1 having a high reverse blocking voltage capability, the drift zone needs to have a sufficient thickness. As a consequence, the maximum MAX of the net doping concentration of the drift zone 118 is located deeply in the semiconductor body 100, that is, at a comparatively large distance from the first side 101. A corresponding doping profile cannot be achieved straightforward with a simple diffusion process. On way out is growing the drift zone 118 epitaxially, thereby properly controlling the gas flow of the dopant's precursors as described above. An alternative method will be explained with reference to FIGS. 16A to 16C.

After providing an uncompleted semiconductor body 100' (e.g. a semiconductor wafer) having a weak basic doping of the first conduction type (here: "n"), a first dopants 411 are implanted through the first side 101 into the semiconductor body 100', see FIG. 16A. The first dopants 411 cause the first conduction type in the semiconductor body 100'.

Figure 16A:
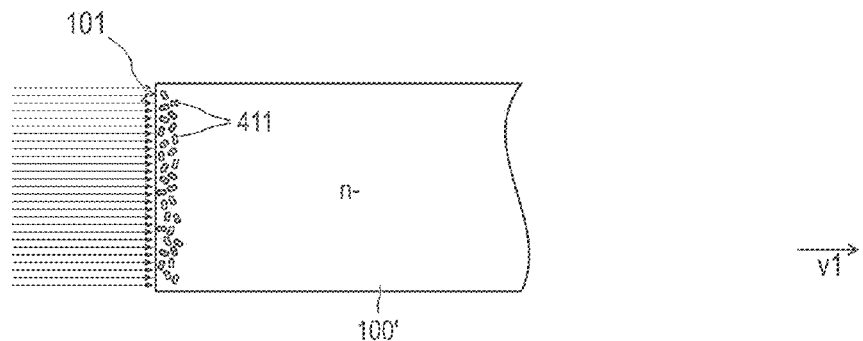
FIGS. 16A-C illustrate different steps for producing a semiconductor device having a drift zone with a maximum doping concentration located deeply in the semiconductor body.
Figure 16B:
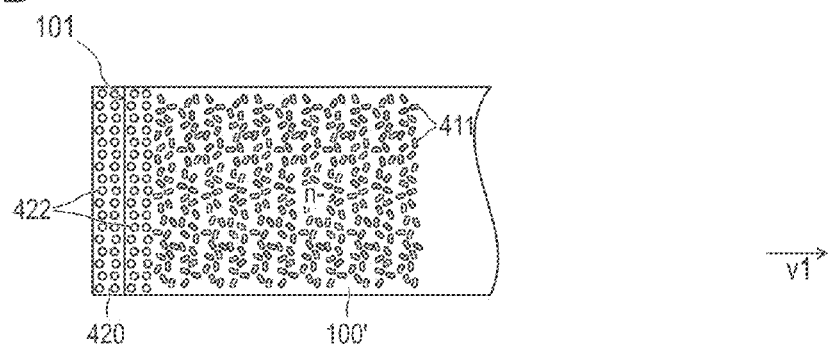

Then, a layer 420 that includes second dopants 422 is grown on the first side 101, see FIG. 16B. The second dopants 422 also produce the first conduction type in the semiconductor body 100'. During a first temperature process, the first and second dopants 411, 422 are diffused into the semiconductor body 100'. During the first temperature process, the temperatures of the semiconductor body 100' may be at least 900° C., for instance between 900° C. and 1000° C.

The first dopants 411 are elected to have a diffusion coefficient in the semiconductor body 100' higher than a diffusion coefficient of the second dopants 422. During the first temperature process, the second dopants 422 help to diffuse the first dopants more deeply into the semiconductor body 100' as the second dopants 422 occupy vacancies, thereby blocking those vacancies for the first dopants 411 and causing the first dopants 411 to more deeply diffuse into the semiconductor body 100'. For instance, the layer 420 that includes the second dopants 422 may be a silicon oxide layer that is doped with the second dopants 422.

Optionally, the first dopants 411 may be dual dopants and the second dopants 422 may be single dopants. A single dopant is an atom that provides, if introduced in the semiconductor body 100', one and only one free charge carrier, i.e., one and only one electron if the dopant acts n-doping, or one and only one hole if the dopant acts p-doping. Accordingly, a dual dopant is an atom that is, if introduced in the semiconductor body 100', able to provide up to two free charge carriers, i.e., up to two electrons if the dopant acts n-doping, or up to two holes if the dopant acts p-doping.

For instance, for a silicon semiconductor body 100' or a silicon carbide semiconductor body 100', suitable single dopants that act n-doping are atoms of the fifth (V) main group of the periodic system (i.e., the nitrogen-phosphorus group), e.g. phosphorus, arsenic, antimony, and suitable dual dopants that act n-doping are atoms of the sixth (VI) main group of the periodic system (i.e., the chalcogen group), e.g. sulphur, selenium, tellurium.

Then, also for a silicon semiconductor body 100' or a silicon carbide semiconductor body 100', suitable single dopants that act p-doping are atoms of the third (III) main group of the periodic system (i.e., the boron group), e.g. boron, aluminum, indium, and suitable dual dopants that act p-doping are atoms of the second (II) main group of the periodic system (i.e., the alkaline earth metals).

Figure 16C:
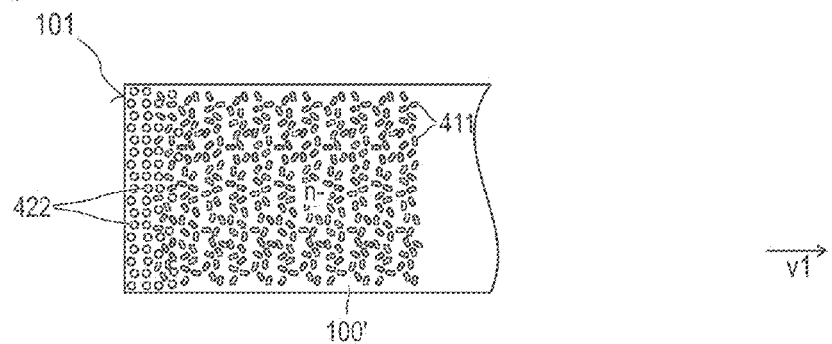

After the first temperature process, the (e.g. silicone oxide based) layer 420 may be removed. The resulting semiconductor body 100' is illustrated in FIG. 16C.

The semiconductor body 100' used for the methods described in connection with FIGS. 16A to 16C, may optionally be a MDZ or a MCZ wafer.

According to a further option, the provided semiconductor body 100' may have a very low basic doping of the first conduction type, for instance less than $1 \cdot 10^{12}$ cm$^{-3}$. Thereby, the basic doping may be constant.

A MDZ wafer is a wafer having an oxygen-deficient surface layer that is achieved by rapid thermal processing (RTP). Due to the RTP-process, the semiconductor body of the wafer, e.g. a CZ wafer, is supersaturated with vacancies which provide a sink in a sufficiently large depth of the semiconductor body. A significant amount of the undesired but unavoidable oxygen in the semiconductor body diffuses toward the sink so that an oxygen-deficient surface layer running parallel to the first side 101 is formed in the semiconductor body. For instance, the oxygen concentration inside such an oxygen-deficient surface layer may be chosen to nowhere exceed $3 \cdot 10^{17}$ cm$^{-3}$. The thickness of the oxygen-deficient surface may be, for instance, at least 10 µm. Suitable MDZ wafers are available from Sun Edison. The diameter of such a semiconductor wafer may be, for instance, at least 6 inches, at least 8 inches or at least 12 inches.

A MCZ wafer is a magnetically grown CZ-wafer. The magnetic field applied during the crystal growth of the wafer causes a reduction of the concentration of oxygen. For instance, the provided wafer/semiconductor body may have a maximum oxygen concentration of less than or equal to $3 \cdot 10^{17}$ cm$^{-3}$.

During the production of a semiconductor device 1, several steps are required to produce a desired doping profile. At an intermediate stage of the production process, the region of the drift zone 118 to be produced may have the first conduction type with a maximum of the (non-final) doping concentration located distant from the location of the rectifying junction 111 to be produced. That is, at that intermediate stage, the (non-final) doping concentration may decrease from that maximum towards the location of the rectifying junction 111 to be produced. As a very strong decrease may adversely affect the blocking voltage capability of the completed semiconductor device 1, it may be desired to reduce that decrease.

Figure 17A:
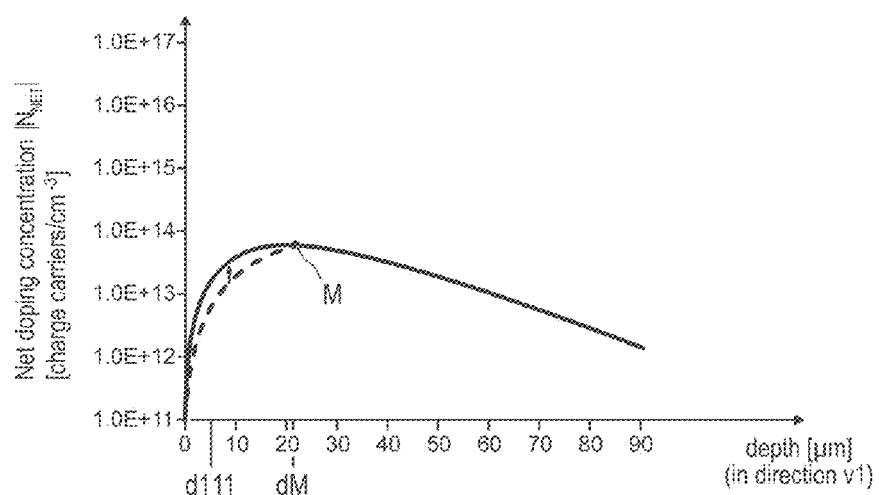
FIGS. 17A-B illustrate a method for locally increasing the doping concentration within a drift zone of a semiconductor device to be produced.

For instance, FIG. 17A illustrates the net doping concentration of the semiconductor body 100' at the intermediate stage (dashed line), and after the decrease has been reduced (solid line).

Figure 17B:
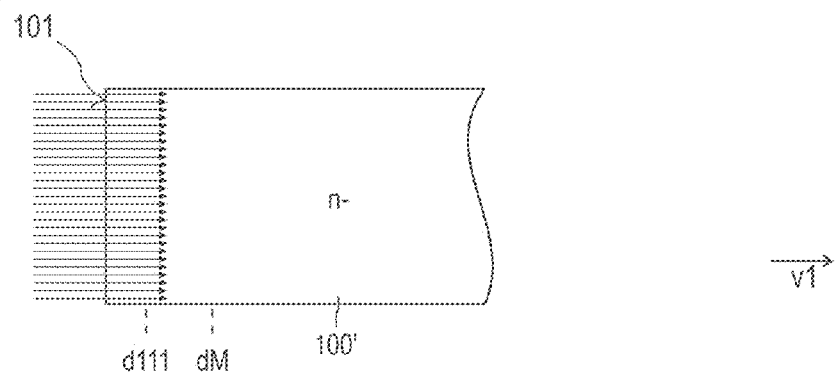

As illustrated in FIG. 17B, reducing the decrease may be realized by implanting electrically active dopants causing the first conduction type into the region between the depth d111 of the rectifying junction 111 to be produced and the depth dM of the maximum M the net doping concentration has in the region of the drift zone 118 to be produced. The implantation dose may be less than $5 \cdot 10^{11}$ cm$^{-2}$ (5E11 cm$^{-2}$), and the implantation may be carried out unmasked.

Figure 18A:
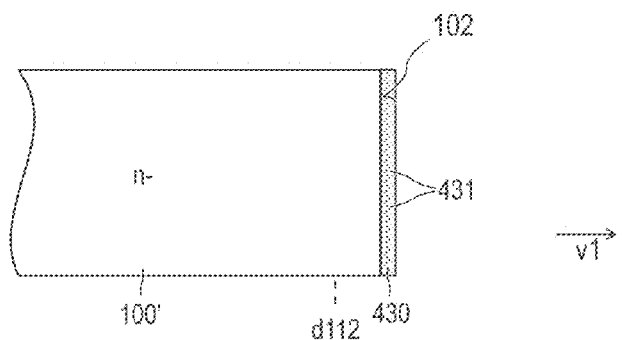
FIGS. 18A-D illustrate various methods for locally the production of a field stop zone.

In order to produce the high net doping concentration of the first conduction type for a field stop zone 119 to be produced, a third layer 430 that includes third dopants 431 may be deposited on the second side 102, see FIG. 18A. The third dopants 431 also produce the first conduction type in the semiconductor body 100'. During a second temperature process, the third dopants 431 are diffused through the second side 102 into the region of the field stop zone 119 to be produced. Suitable dopants are, for instance, single dopants or dual dopants. For instance, if the first conduction type is "n", a chalcogenide may be used as dual dopant.

Figure 18B:
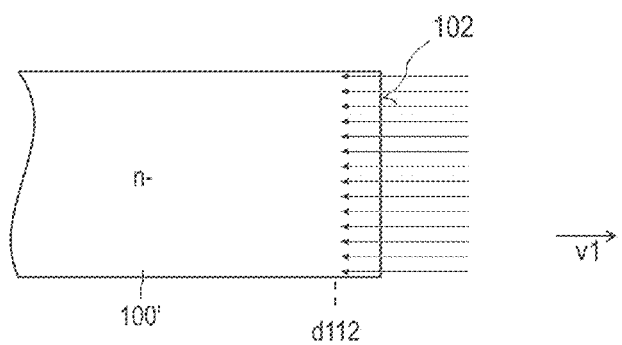

Alternatively or in addition, particles causing the first conduction type may be implanted through the second side 102 into the region of the field stop zone 119 to be produced. The implantation may be carried out with one or more implantations at different implantation energies and/or at different implantation doses. For instance, FIG. 18B illustrates a first implantation step carried out with first particles at first implantation dose and a first implantation depth, and FIG. 18C a second implantation step carried out with second particles at a second implantation dose and a second implantation depth. In the illustrated example, the first implantation depth is higher than the second implantation depth, and the second implantation dose is higher than the first implantation dose. However, any other combination of at least two implantation steps with at least one deviating parameter (e.g. implantation depth, implantation dose, particle type) is also possible. As the first and second particles are implanted through the second side 102, the first and second implantation depth are to be measured relative to the second side 102.

The implanted particles may be conventional electrically active dopants. If the first conduction type is "n", alternatively or in addition to electrically active dopants, also protons may be used as implanted particles, as implanted protons in combination with a subsequent thermal process generate donors following a damage concentration profile of the crystal damages caused by the proton implantation.

Figure 18C:
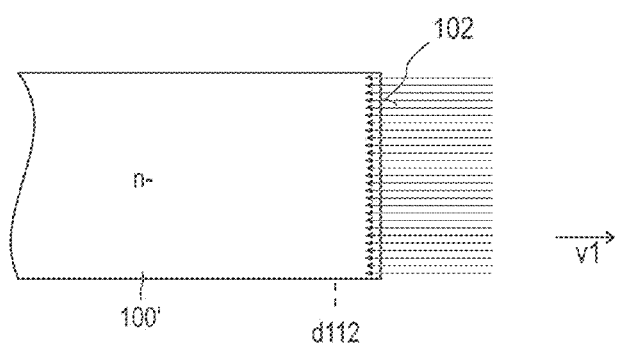
Figure 18D:
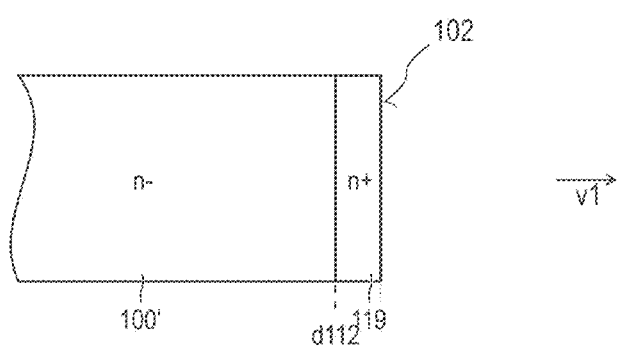

The methods described with reference to FIGS. 18A to 18C may be used in any combination. In any case, the result is a semiconductor body 100' having a field stop zone 119 as illustrated in FIG. 18D.

Figure 19:
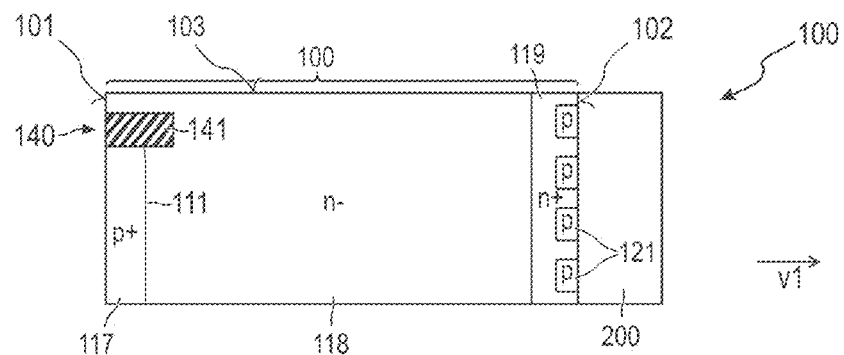
FIG. 19 illustrates a section of a semiconductor device having a vertical edge termination.

FIG. 19 illustrates a section of an epitaxially grown semiconductor body 100 of a semiconductor device 1. The semiconductor body 100 has first side 101, a second side 102, a lateral edge 103, and a vertical edge termination structure arranged between the rectifying junction 111 and the lateral edge 103. The vertical edge termination structure has a trench 140 that extends from the first side 101 into the semiconductor body 100 and that is filled with a dielectric 141, for instance benzocyclobutene (BCB). Filling the trench 140 with the dielectric 141 is carried out in a state in which the semiconductor body 100 is still arranged on the semiconductor carrier 200. That is, removing the semiconductor carrier 200 from the semiconductor body 100 takes place in a state in which the trench 140 is already filled with the dielectric 141.

The dielectric 141 may be a low-shrink dielectric, e.g. BCB. As the temperature resistance of dielectrics 141 having a low shrink usually lies below 250° C., it is advantageous to not expose the semiconductor body 100 to temperatures of more than 250° C. after the trench 140 has been filled with a low-shrink dielectric 141.

Instead of or in addition to the illustrated edge termination structure, a different edge termination structure, e.g. field rings, field plates, VLD (variable lateral doping), JTE (junction termination extension) or RESURF (reduced surface field) may be used as well.

In the above description, it was explained on the basis of specific embodiments how the invention may be practiced. Unless mentioned to the contrary, the features of the semiconductor devices and method steps described above may be combined in any different combination.

Any semiconductor wafer or semiconductor body according to the present invention, can have any semiconductor base material such as silicon, silicon carbide, silicon nitride, gallium arsenide, gallium nitride or any other suitable semiconductor base material.

Further, in the examples of the present specification, the first conduction type is described to be "n" and the second conduction type to be "p". However, it is also possible to select "p" for the first conduction type and "n" for the second conduction type.

The electrodes 151, 152 and, if provided, 153 may be deposited on the first side 101 and the second side 102 prior to or after the production of the semiconductor body 100 (including the final doping profile) has been completed. It is to be noted that all semiconductor devices 1 according to the invention have at least a first main electrode 151 arranged on the first side 101 and a second main electrode 152 arranged on the second side 102. In particular, the semiconductor devices 1 according to the present invention may be so-called "vertical" semiconductor devices.

As described above, the drift zone 118 of a semiconductor device 1 may have a doping charge centroid at a first depth d1 which is chosen such that $d111 < d1 < d111 + 0.37 \cdot t118$. It turned out that such a semiconductor device 1 has a favorable switching off behavior which is exemplarily demonstrated with reference to FIGS. 20A, 20B and 20C based on computer simulations. In each of FIGS. 20A, 20B and 20C, the abscissa relates to the time t, the left ordinate axis to the diode current, and the right ordinate axis to the diode voltage. The scaling is identical so that the curves of the different figures can easily be compared.

Figure 20A:
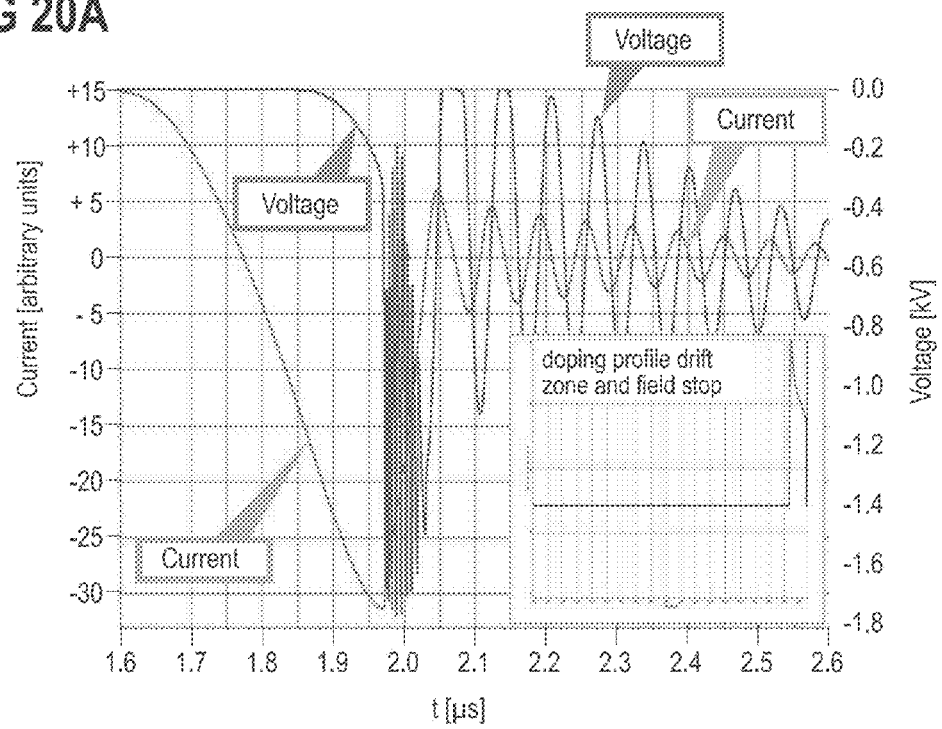
FIG. 20A shows the switching behavior of a conventional diode having a drift zone with constant net doping concentration.

FIG. 20A relates to a conventional diode having a drift zone with a constant net doping concentration. That is, the doping charge centroid is located in at 50% of the thickness of the drift zone. As can be seen, the conventional diode shows a significant oscillation behavior.

Figure 20B:
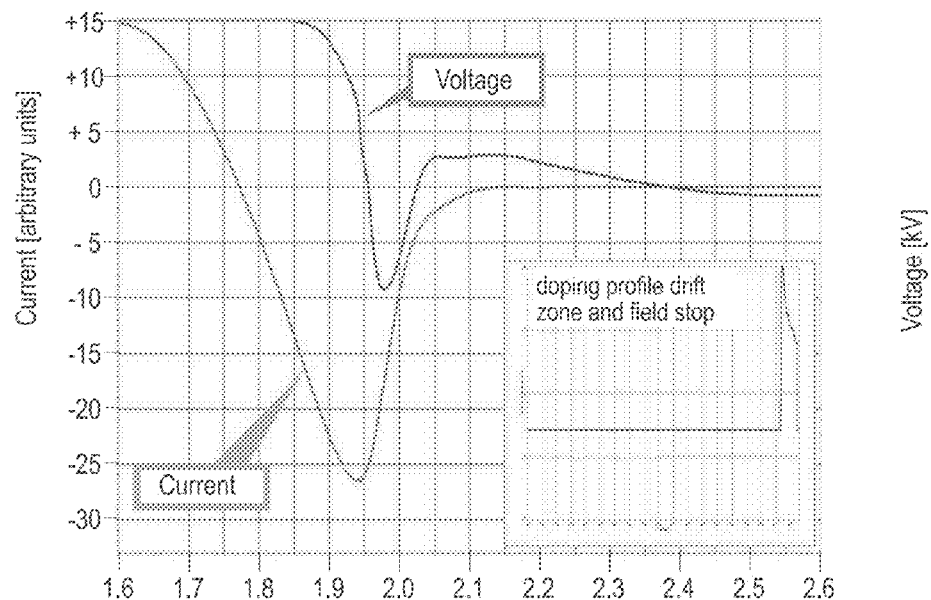
FIG. 20B shows the switching behavior of a diode according to FIG. 20A but additionally having a minority charge carrier delivering structure embedded in the field stop zone.

FIG. 20B relates to a diode according to the invention. It has the same structure as the diode of FIG. 20A with the exception that a minority charge carrier delivering structure according to FIGS. 3 and 5 is additionally embedded in the field stop region 119. The dose of the dopants in the drift zone is the same as that of the drift zone of FIG. 20A. That is, the integrals of the net doping concentrations of the corresponding drift zones are identical.

Figure 20C:
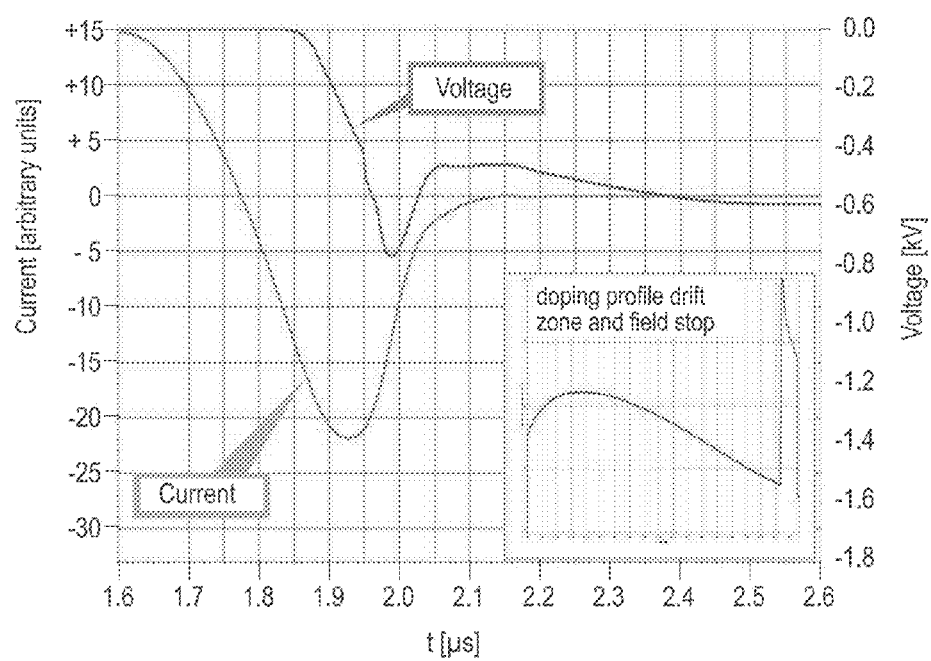
FIG. 20C shows the switching behavior of a diode having a drift zone with a doping charge centroid that is located at a distance of less than 37% of the thickness of the drift zone from the rectifying junction.

FIG. 20C relates to a diode according to the invention. It has the same structure as the diode of FIG. 20A with the exception that the doping charge centroid of the drift zone at the first depth d1 is chosen such that $d111 < d1 < d111 + 0.37 \cdot t118$. The dose of the dopants in the drift zone is the same as that of the drift zone of FIG. 20A. That is, the integrals of the net doping concentrations of the corresponding drift zones are identical.

Figure 21:
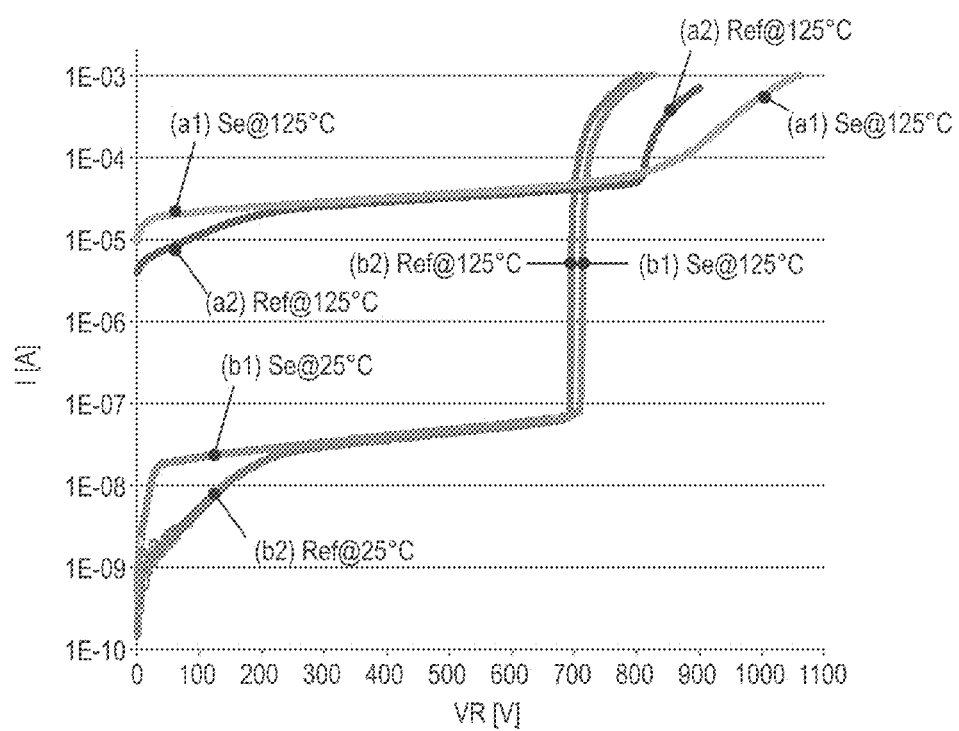
FIG. 21 shows the blocking behavior of a diode according to the invention compared to a conventional diode.

FIG. 21 shows, for two temperatures 25° C. and 125° C., the blocking characteristic of conventional reference diode (labelled with "ref") having a drift zone with constant net doping concentration in comparison with a diode according to the invention whose doping profile of the drift zone 118 has been produced with selenium as the first (dual) dopants and phosphorus as the second (single) dopants as described with reference to FIGS. 16A to 16D. The net doping concentration of the drift zone of the diode according to the invention is such that the first depth is greater than 0 and less than 37 percent of a thickness the drift zone has in the vertical direction. The drift zones of the diode according to the invention and the reference diode are doped with identical doses. That is, the integrals of the net doping concentrations over the drift zones are equal.

Curve (a1) relates to the diode according to the invention at 125° C., (a2) to the reference diode at 125° C., (b1) to the diode according to the invention at 25° C., and (b2) to the reference diode at 25° C.

As can be seen from FIG. 21, at both temperatures the diode according to the invention allows for a higher reverse blocking voltage VR.

Figure 22:
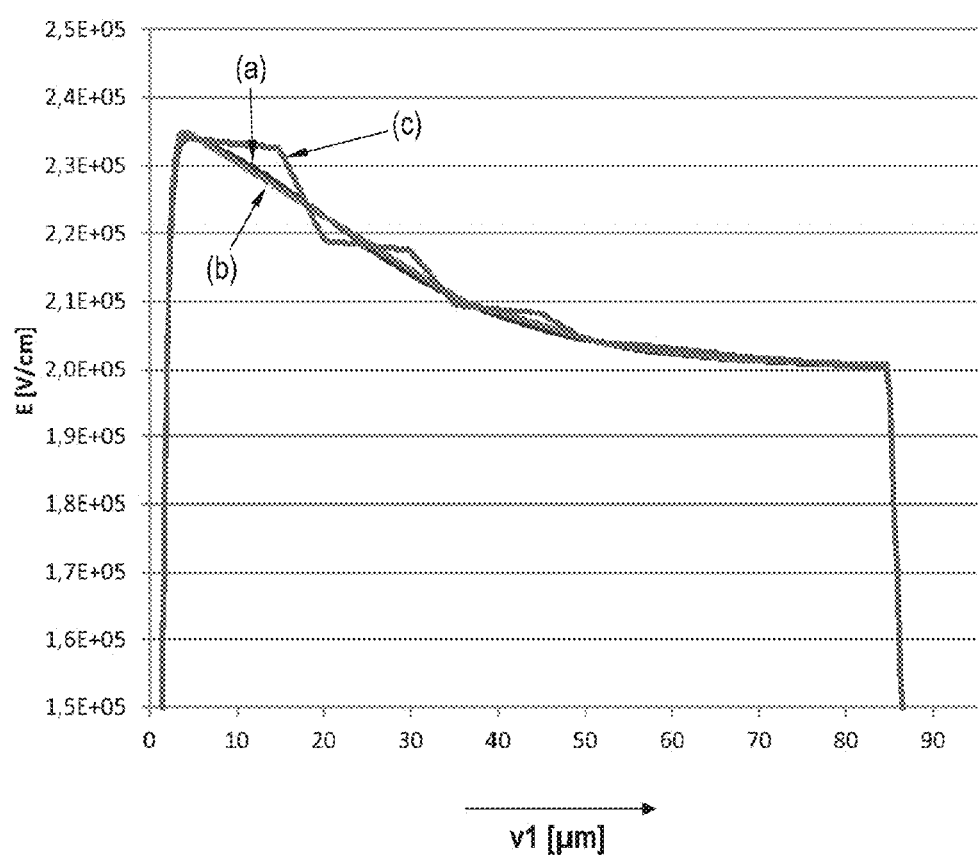
FIG. 22 illustrates the electric field of semiconductor devices having the doping profiles of FIGS. 2, 10 and 11 when the rectifying junction is reverse biased.

Finally, FIGS. 22 to 29 illustrate the behaviour and properties of semiconductor devices 1 as explained above. FIG. 22 illustrates the electric field of the semiconductor devices 1 having the doping profile of FIG. 2 (curve (a)), FIG. 10 (curve (b)) and FIG. 11 (curve (c)) when the semiconductor device 1 blocks, which is when the rectifying junction 111 is reverse biased.

Figure 23:
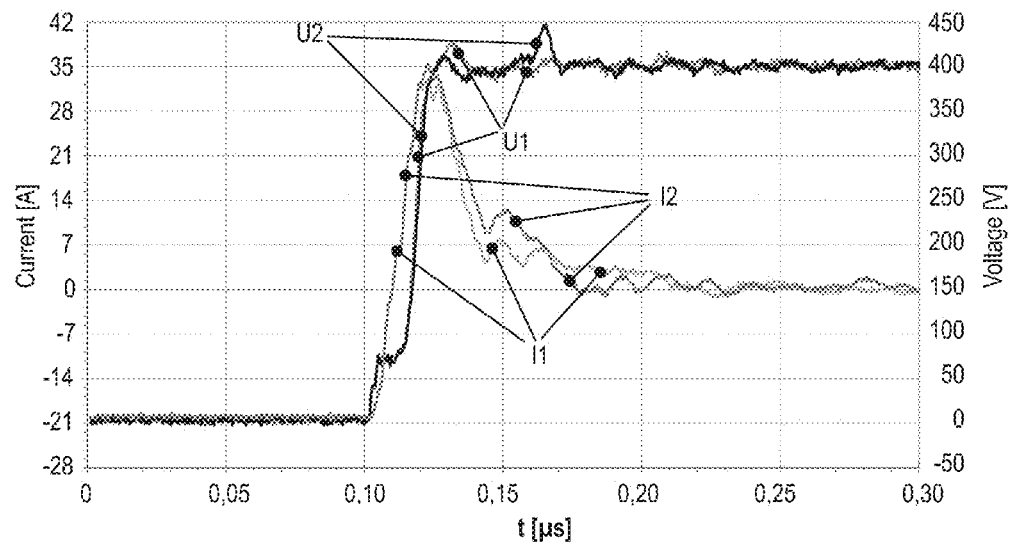
FIG. 23 compares the switching-off behaviour of a diode having a minority charge carrier delivering structure and the switching-off behaviour of a diode having no minority charge carrier delivering structure, wherein switching off takes place at the diode's rated current in each case.
Figure 24:
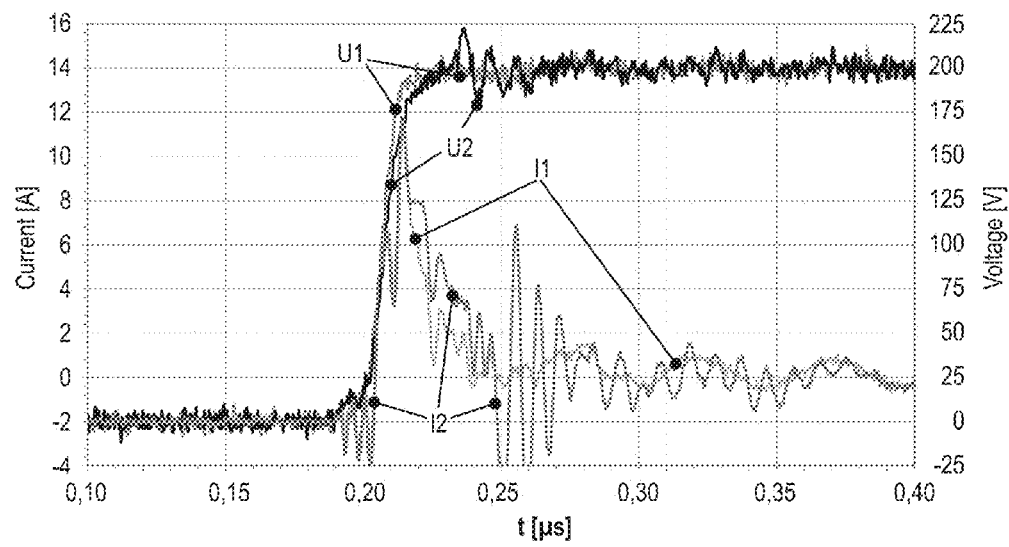
FIG. 24 illustrates the effect of a charge carrier delivering structure on the switching-off behaviour of the diodes of FIG. 23, but wherein switching off takes place at a tenth of the diode's rated current.

FIG. 23 illustrates the switching-off behaviour of a first and second diode each having a drift zone with constant net doping concentration. Compared with the second diode (diode voltage U2 and diode current I2), the first diode (diode voltage U1 and diode current I1) additionally has a minority charge carrier delivering structure 121 (p-doped islands as illustrated in FIG. 4). At the time the first and second diodes are switched off, the diode currents I1 and, respectively, I2 are equal to the rated current (20 A) of the respective diode. FIG. 24 shows the same parameters for the same diodes as FIG. 23, however, at the time the diodes are switched off, the diode currents I1 and I2 are a tenth (2 A) of the respective rated current (20 A). Comparing FIGS. 23 and 24 it can be seen that in particular at low currents (FIG. 24), the second diode shows, compared with the first diode, significant switching-off oscillations. The smoothening effect of the minority charge carrier delivering structure 121 emerges in particular at low diode currents as at high currents the diode's semiconductor body is heavily flooded with free charge carriers which serve to soften the switching-off process. In contrast, at low diode currents, the number of free charge carriers in the diode's semiconductor body is small so that there are less free charge carriers for softening the switching-off behaviour. Hence, the smoothing effect caused by the minority charge carriers are injected by the charge carrier delivering structure 121 into the semiconductor body when the diode is switched off becomes apparent in particular at low diode currents.

Figure 25:
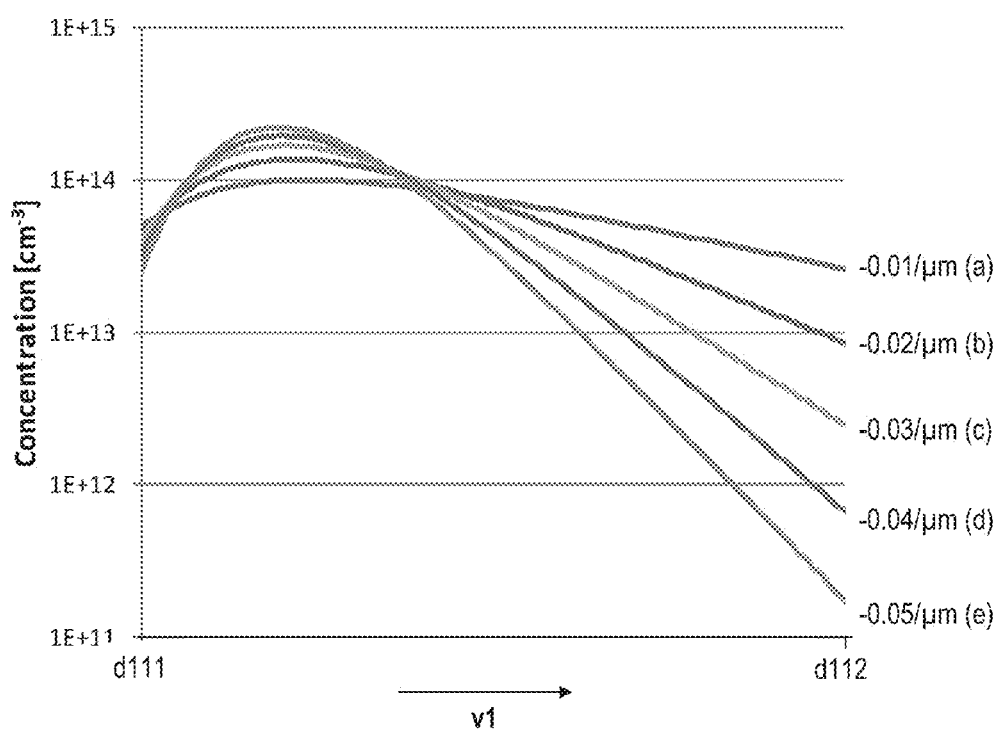
FIG. 25 illustrates different doping profiles of the drift zones of semiconductor devices according to FIG. 2 having different gradients of the net doping concentration in the drift zone.

FIG. 25 illustrates different doping profiles (net doping concentrations) of only the drift zones 118 of semiconductor devices having doping profiles according to FIG. 2 with different gradients $d(\log_{10}((N_{NET} \cdot cm^3)/dv1)$. For all profiles, the integral of the net doping concentration $N_{NET}$ of the drift zone 118 is the same. The gradient $d(\log_{10}((N_{NET} \cdot cm^3)/dv1)$ is −0.01/μm for profile (a), −0.02/μm for profile (b), −0.03/μm for profile (c), −0.04/μm for profile (d) and −0.05/μm for profile (e).

Figure 26:
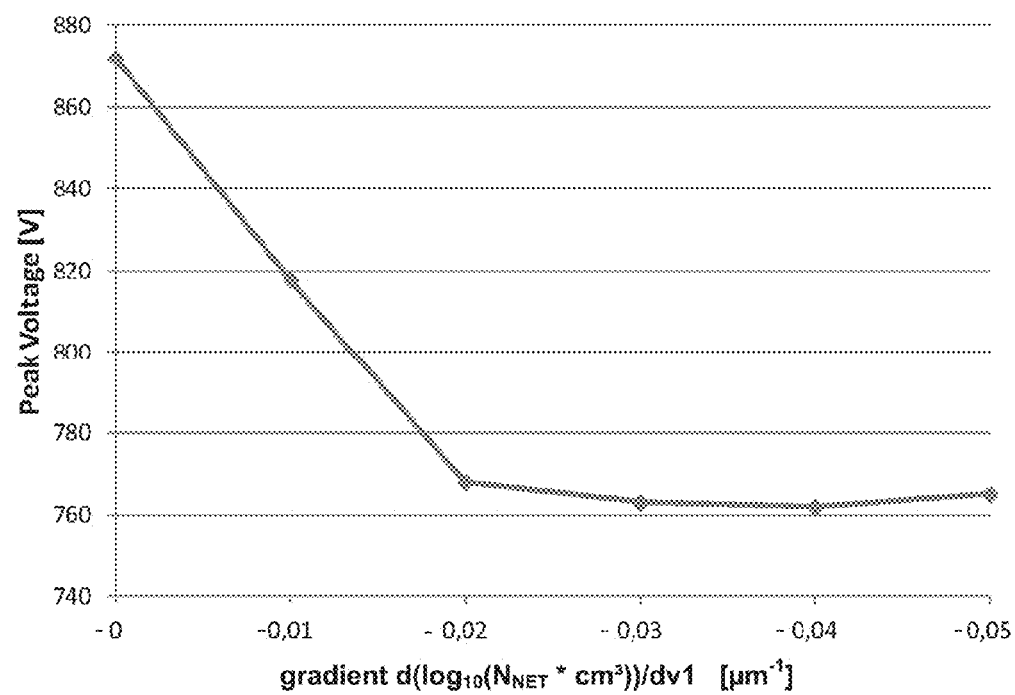
FIG. 26 illustrates the peak voltages that occur when the semiconductor devices of FIG. 25 are switched off.

FIG. 26 illustrates the peak voltages that occur when the semiconductor devices of FIG. 25 are switched off. The value 0/μm of the gradient relates to a conventional semiconductor device having a drift zone 118 with a constant net doping concentration. As will become clear from FIG. 26, the peak voltage (voltage overshoot) significantly decreases in particular in the range between 0 μm$^{-1}$ and −0.02 μm$^{-1}$.

Figure 27:
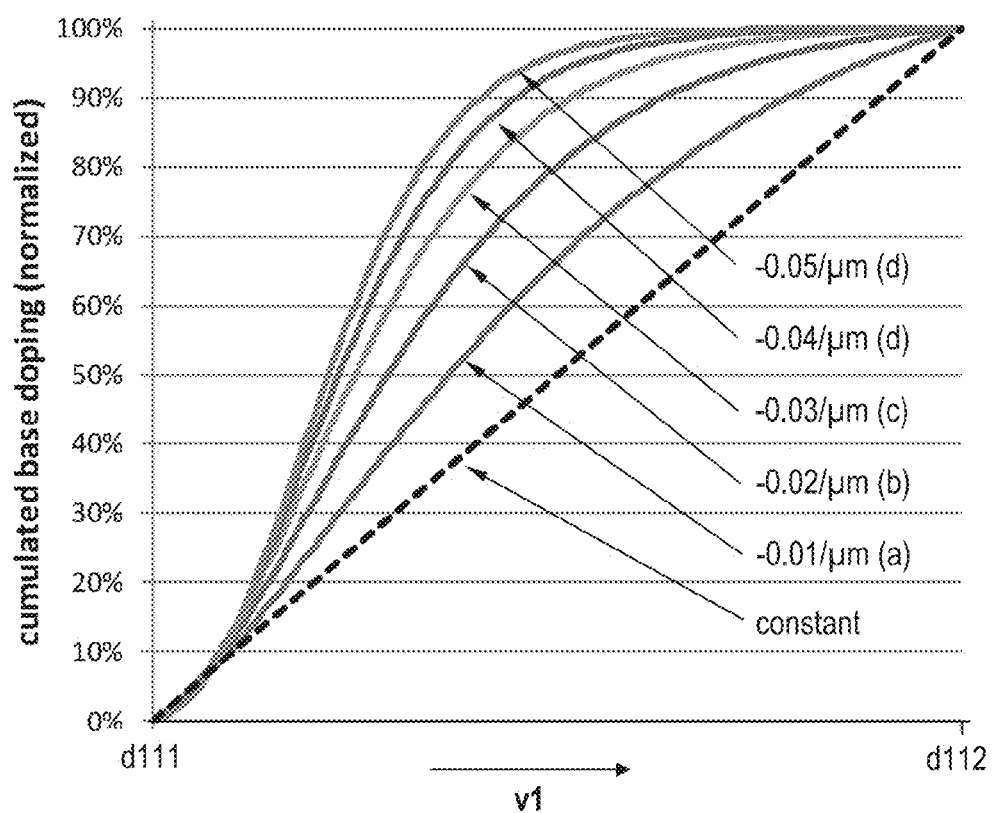
FIG. 27 illustrates for the doping profiles of FIG. 25 the cumulated doping dose of the drift zone.

FIG. 27 illustrates for the doping profiles of FIG. 25 the cumulated dose of the drift zone 118, that is, the integral of the net doping concentration of the drift zone 118, wherein the integration starts at the rectifying junction 111.

Figure 28:
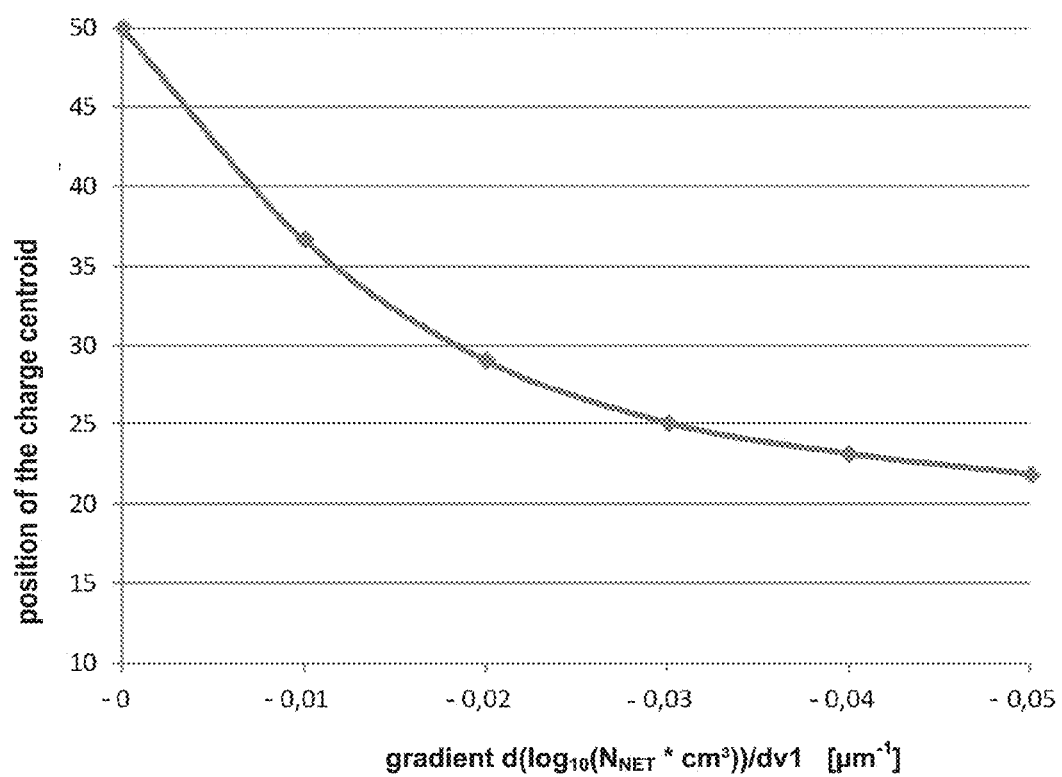
FIG. 28 illustrates the position of the doping charge centroids of the drift zone for the semiconductor devices of FIG. 27.

FIG. 28 illustrates the position of the doping charge centroid of the drift zone 118 in percent of the thickness t118 of the drift zone 118 for the semiconductor devices of FIG. 27.

Figure 29:
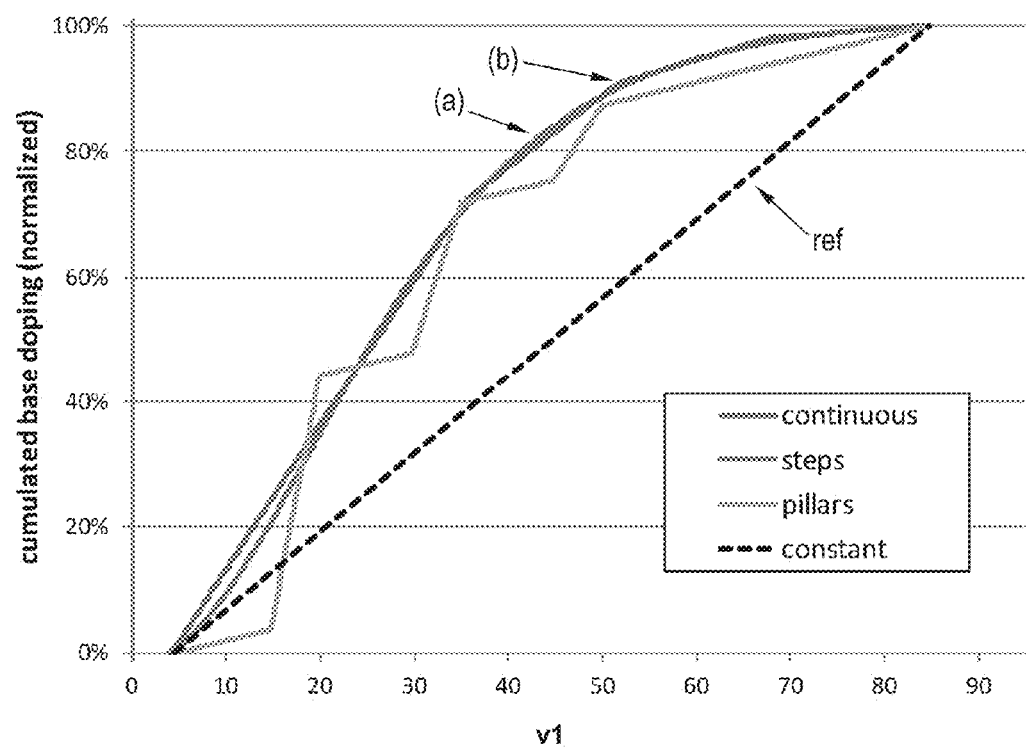
FIG. 29 illustrates for the doping profiles of FIGS. 2, 10 and 11 the cumulated doping dose of the drift zone.

Finally, FIG. 29 illustrates, according to FIG. 27, for the doping profiles of FIG. 2 (curve (a)), FIG. 10 (curve (b) and FIG. 11 (curve (c)) the cumulated dose of the drift zone 118, that is, the integral of the net doping concentration of the drift zone 118, wherein the integration starts at the rectifying junction 111.

The invention claimed is:

1. A semiconductor device comprising:
a semiconductor body having a first side and a second side opposite the first side, the second side being arranged distant from the first side in a first vertical direction;
a rectifying junction;
a field stop zone of a first conduction type arranged in the semiconductor body; and
a drift zone of the first conduction type arranged in the semiconductor body between the rectifying junction and the field stop zone;
wherein the semiconductor body has, along a straight line running parallel to the first vertical direction, a net doping concentration; and
wherein at least one of (a) and (b) applies:
(a) the drift zone comprises, at a first depth, a doping charge centroid, wherein a distance between the rectifying junction and the doping charge centroid is less than 37% of a thickness of the drift zone in the first vertical direction;
(b) the absolute value of the net doping concentration comprises, along the straight line and inside the drift zone, a local maximum value.

2. The semiconductor device of claim 1, wherein the local maximum value is located at a depth that is:
greater than a depth of the rectifying junction; and
less than the mean value of the depth of the rectifying junction and a depth of a border between the drift zone and the field stop zone.

3. The semiconductor device of claim 1, wherein the drift zone comprises a second depth arranged distant from both the rectifying junction and the field stop zone, at which second depth the decimal logarithm of the product of the net doping concentration and 1 cm$^3$ comprises, in the first vertical direction, a gradient $$\frac{d}{dv1}\log_{10}(N_{NET}\cdot cm^3)$$

of less than—0.01/μm, wherein
v1 is the first vertical direction; and
$N_{NET}$ is the net doping concentration.

4. The semiconductor device of claim 1, wherein the drift zone comprises a second depth arranged distant from both the rectifying junction and the field stop zone, at which second depth the decimal logarithm of the product of the net doping concentration and 1 cm$^3$ comprises, in the first vertical direction, a gradient $$\frac{d}{dv1}\log_{10}(N_{NET}\cdot cm^3)$$

of less than—0.02/μm, wherein
v1 is the first vertical direction; and
$N_{NET}$ is the net doping concentration.

5. The semiconductor device of claim 1, wherein:
the decimal logarithm of the product of the net doping concentration and 1 cm$^3$ comprises, inside the drift zone, for each second depth within a depth range, in the first vertical direction a gradient $$\frac{d}{dv1}\log_{10}(N_{NET}\cdot cm^3)$$

less than—0.01/μm;
each second depth is greater than a depth of the rectifying junction and less than a depth of a border between the drift zone and the field stop zone; and
the depth range is at least 10% of a thickness of the drift zone, wherein
v1 is the first vertical direction; and
$N_{NET}$ is the net doping concentration.

6. The semiconductor device of claim 5, wherein:
the decimal logarithm of the product of the net doping concentration and 1 cm$^3$ comprises, inside the drift zone, for each second depth within a depth range, in the first vertical direction a gradient $$\frac{d}{dv1}\log_{10}(N_{NET}\cdot cm^3)$$

of less than—0.02/μm.

7. The semiconductor device of claim 1, wherein the drift zone comprises, in the first vertical direction, a local maximum of the net doping concentration arranged distant from both the rectifying junction and the field stop zone.

8. The semiconductor device of claim 1, comprising a minority charge carrier delivering structure having a second conduction type complementary to the first conduction type, the minority charge carrier delivering structure being embedded in the field stop zone such that the field stop zone continuously extends between the drift zone and the first side.

9. The semiconductor device of claim 8, wherein the minority charge carrier delivering structure is reticulated.

10. The semiconductor device of claim 8, wherein the minority charge carrier delivering structure comprises a plurality of islands arranged distant from one another.

11. The semiconductor device of claim 8, wherein the minority charge carrier delivering structure is arranged distant from the second side.

12. The semiconductor device of claim 8, wherein the minority charge carrier delivering structure extends as far as the second side.

13. The semiconductor device of claim 1, comprising:
a collector zone comprising a first sub-region and a second sub-region, both the first and second sub-regions being arranged between the field stop zone and the second side and having a second conduction type complementary to the first conduction type; wherein
the semiconductor device is an IGBT;
the first collector zone has a net doping concentration higher than the second collector zone; and
the first collector zone and the second collector zone intermesh.

14. A method for producing a semiconductor device, the method comprising:
providing a semiconductor carrier;
producing a semiconductor construct on the semiconductor carrier, thereby epitaxially growing a crystalline semiconductor structure on the semiconductor carrier; and, afterwards,
removing the semiconductor carrier so that a semiconductor device remains that comprises;
a semiconductor body having a first side and a second side opposite the first side, the second side being arranged distant from the first side in a first vertical direction;
a rectifying junction;
a field stop zone of a first conduction type arranged in the semiconductor body; and
a drift zone of the first conduction type arranged in the semiconductor body between the rectifying junction and the field stop zone;
wherein the semiconductor body has, along a straight line running parallel to the first vertical direction, a net doping concentration; and
wherein at least one of (a) and (b) applies:
(a) the drift zone comprises, at a first depth, a doping charge centroid, wherein a distance between the rectifying junction and the doping charge centroid is less than 37% of the thickness the drift zone has in the first vertical direction;
(b) the absolute value of the net doping concentration comprises, along the straight line and inside the drift zone, a local maximum value.

15. The method of claim 14, wherein the absolute value of the net doping concentration has, along the straight line and inside the drift zone, a maximum value located at a depth that is:
greater than a depth of the rectifying junction; and
less than the mean value of the depth of the rectifying junction and a depth of a border between the drift zone and the field stop zone.

16. The method of claim 14, wherein epitaxially growing the crystalline semiconductor structure comprises:
epitaxially growing the drift zone, thereby depositing at least one electrically active dopant from a gaseous phase on the semiconductor carrier such that the achieved net doping concentration of the drift zone of the completed semiconductor device is formed.

17. The method of claim 14, wherein the crystalline semiconductor carrier is a Czochralski wafer.

18. The method of claim 14, wherein:
in a state in which prior to removing the semiconductor carrier, a trench extending from the first side into the semiconductor body is formed and subsequently filled with a dielectric; and
the semiconductor body is, after filling the trench with the dielectric, permanently kept at temperatures below 250° C.

19. A method for producing a semiconductor device, the method comprising:
providing a semiconductor body having a first side and a second side opposite the first side;
introducing electrically active first dopants causing a first conduction type through the first side into the semiconductor body and introducing electrically active second dopants causing the first conduction type through the first side into the semiconductor body, wherein the first dopants comprise a diffusion coefficient in the semiconductor body higher than a diffusion coefficient of the second dopants;
producing a rectifying junction; and
producing a field stop zone of the first conduction type arranged in the semiconductor body such that the semiconductor body has a drift zone of the first conduction type arranged in the semiconductor body between the rectifying junction and the field stop zone; and
such that a semiconductor device is formed that comprises:
a semiconductor body having a first side and a second side opposite the first side, the second side being arranged distant from the first side in a first vertical direction;
a rectifying junction;
a field stop zone of a first conduction type arranged in the semiconductor body; and
a drift zone of the first conduction type arranged in the semiconductor body between the rectifying junction and the field stop zone;
wherein the semiconductor body has, along a straight line running parallel to the first vertical direction, a net doping concentration; and
wherein at least one of (a) and (b) applies:
(a) the drift zone comprises, at a first depth, a doping charge centroid, wherein a distance between the rectifying junction and the doping charge centroid is less than 37% of the thickness the drift zone has in the first vertical direction;
(b) the absolute value of the net doping concentration comprises, along the straight line and inside the drift zone, a local maximum value.

20. The method of claim 19, wherein the absolute value of the net doping concentration has, along the straight line (g) and inside the drift zone, a maximum value located at a depth that is:
greater than a depth of the rectifying junction; and
less than the mean value of the depth of the rectifying junction and a depth of a border between the drift zone and the field stop zone.

21. The method of claim 19, wherein:
the first dopants are single dopants; and
the second dopants are dual dopants.

22. The method of claim 19, wherein:
the first dopants are selected from one of: phosphorus; arsenic; antimony; and
the second dopants are selected from one of: sulphur; selenium; tellurium.

23. The method of claim 19, wherein the semiconductor body is a MCZ wafer or a MDZ wafer.

24. The method of 19, wherein at least one of the first dopants and the second dopants are diffused more deeply into the semiconductor body in a first temperature process in which the semiconductor body is heated to temperatures of between 900° C. and 1000° C.

* * * * *